United States Patent
Shimada

(10) Patent No.: US 8,975,005 B2
(45) Date of Patent: *Mar. 10, 2015

(54) BLACK CURABLE COMPOSITION FOR WAFER LEVEL LENS AND WAFER LEVEL LENS

(75) Inventor: Kazuto Shimada, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/497,368

(22) PCT Filed: Sep. 28, 2010

(86) PCT No.: PCT/JP2010/067318
§ 371 (c)(1),
(2), (4) Date: Mar. 21, 2012

(87) PCT Pub. No.: WO2011/040626
PCT Pub. Date: Apr. 7, 2011

(65) Prior Publication Data
US 2012/0202154 A1    Aug. 9, 2012

(30) Foreign Application Priority Data

Sep. 30, 2009 (JP) ................. 2009-227927

(51) Int. Cl.
G03F 7/20 (2006.01)
G03F 7/004 (2006.01)
C09D 4/06 (2006.01)
G02B 5/22 (2006.01)
G02B 3/00 (2006.01)
G03F 7/032 (2006.01)
G02B 5/20 (2006.01)
(Continued)

(52) U.S. Cl.
CPC *C09D 4/06* (2013.01); *G02B 5/223* (2013.01);
*G02B 3/0068* (2013.01); *G03F 7/20* (2013.01);
*G03F 7/032* (2013.01); *C08F 2/44* (2013.01);
*C08F 2/48* (2013.01); *C08F 222/1006* (2013.01); *C08K 3/22* (2013.01); *G02B 3/0031* (2013.01); *G02B 5/201* (2013.01); *G03F 1/56* (2013.01)
USPC ............ 430/321; 430/270.1; 430/285.1; 359/614; 359/619; 359/893

(58) Field of Classification Search
None
See application file for complete search history.

(56) References Cited

U.S. PATENT DOCUMENTS 5,498,498 A * 3/1996 Uchikawa et al. ............ 430/7
6,426,829 B1   7/2002 Feldman et al.
(Continued)

FOREIGN PATENT DOCUMENTS

CN   101349865 A   1/2009
CN   101454721 A   6/2009
(Continued)

OTHER PUBLICATIONS

Office Action dated Nov. 26, 2014 in Japanese Application No. 2010-204361.
(Continued)

*Primary Examiner* — Martin Angebranndt
(74) *Attorney, Agent, or Firm* — Sughrue Mion, PLLC

(57) ABSTRACT

A black curable composition for a wafer level lens includes (A) a metal-containing inorganic pigment, (B) a polymerization initiator, and (C) a polymerizable compound. The (A) metal-containing inorganic pigment is preferably titanium black.

12 Claims, 7 Drawing Sheets

(51) Int. Cl.
    *G03F 1/56* (2012.01)
    *C08F 2/44* (2006.01)
    *C08F 2/48* (2006.01)
    *C08F 222/10* (2006.01)
    *C08K 3/22* (2006.01)

(56) References Cited

U.S. PATENT DOCUMENTS

| | | | |
|---|---|---|---|
| 6,596,445 B1* | 7/2003 | Matsumoto et al. | 430/7 |
| 2006/0103931 A1* | 5/2006 | Yakushiji et al. | 359/454 |
| 2006/0262416 A1 | 11/2006 | Lee et al. | |
| 2007/0114932 A1* | 5/2007 | Kim | 313/582 |
| 2009/0023085 A1 | 1/2009 | Tsuchimura | |
| 2009/0111048 A1 | 4/2009 | Miyabe et al. | |
| 2009/0147368 A1* | 6/2009 | Oh et al. | 359/622 |
| 2009/0236509 A1* | 9/2009 | Maruyama et al. | 250/237 R |
| 2009/0246651 A1* | 10/2009 | Fujimori et al. | 430/7 |
| 2010/0046096 A1 | 2/2010 | Hirao et al. | |
| 2010/0243970 A1 | 9/2010 | Toshimitsu et al. | |
| 2011/0124824 A1* | 5/2011 | Nagata et al. | 525/451 |
| 2011/0294049 A1* | 12/2011 | Makino et al. | 430/7 |
| 2012/0134028 A1* | 5/2012 | Maruyama | 359/601 |
| 2012/0199727 A1* | 8/2012 | Kubota | 250/214.1 |
| 2012/0243099 A1* | 9/2012 | Kaneko | 359/611 |
| 2012/0250166 A1* | 10/2012 | Idei et al. | 359/722 |
| 2013/0028587 A1* | 1/2013 | Kaneko et al. | 396/439 |

FOREIGN PATENT DOCUMENTS

| | | | |
|---|---|---|---|
| EP | 2182396 | * | 5/2010 |
| JP | 08-036257 | * | 2/1996 |
| JP | 2552391 | * | 11/1996 |
| JP | 10-046042 | * | 2/1998 |
| JP | 2000-080068 | * | 3/2000 |
| JP | 2000-089025 | * | 3/2000 |
| JP | 2005-017322 | * | 1/2005 |
| JP | 2005-300857 | * | 10/2005 |
| JP | 2006-036750 | * | 2/2006 |
| JP | 2006-323365 A | | 11/2006 |
| JP | 2007-164072 | * | 6/2007 |
| JP | 3926380 B1 | | 6/2007 |
| JP | 2007-249046 A | | 9/2007 |
| JP | 2007-322485 A | | 12/2007 |
| JP | 2009-191061 A | | 8/2009 |
| JP | 2011-027867 A | | 2/2011 |
| TW | 2009-25777 A | | 6/2009 |
| WO | 2008/102648 A1 | | 8/2008 |
| WO | 2009/025297 | * | 2/2009 |
| WO | 2009/113615 A1 | | 9/2009 |
| WO | 2011/004908 | * | 1/2011 |

OTHER PUBLICATIONS

Office Action dated Dec. 23, 2013 in Chinese Application No. 201080040448.6.

Office Action (Written Opinion) issued in Singapore Patent Application No. 201202020-2 on Jan. 30, 2014.

Office Action dated Jun. 2, 2014 issued from the Korean Patent Office in a Korean Patent Application No. 10-2012-7006782.

Communication dated Aug. 19, 2014, issued by the Taiwan Patent Office in corresponding Taiwanese Application No. 099132928.

* cited by examiner

BLACK CURABLE COMPOSITION FOR WAFER LEVEL LENS AND WAFER LEVEL LENS

CROSS REFERENCE TO RELATED APPLICATIONS

This application is a National Stage of International Application No. PCT/JP2010/067318 filed Sep. 28, 2010, claiming priority based on Japanese Patent Application Nos. 2009-227927 filed Sep. 30, 2009, the contents of all of which are incorporated herein by reference in their entirety.

TECHNICAL FIELD

The present invention relates to a black curable composition for a wafer level lens, which is useful for the formation of a light-shielding film of a wafer level lens array composed of plural lens disposed on a substrate, and to a wafer level lens obtained by using the same.

BACKGROUND ART

In recent years, small and thin image pickup units have been mounted on portable electronic terminal devices such as mobile phones and PDAs (Personal Digital Assistants). Such image pickup units generally have a solid-state image pickup device such as a Charge Coupled Device (CCD) image sensor or a Complementary Metal-Oxide Semiconductor (CMOS) image sensor, and a lens for forming an image of the subject on the solid-state image pickup device.

With miniaturization and thickness reduction of portable terminals and propagation of portable terminals, further miniaturization and thickness reduction of image pickup units to be mounted thereon are requested, together with provision of adequate productivity. To cope with such a request, a mass-production method of an image pickup unit is known whereby a lens substrate having plural lenses formed thereon and a sensor substrate having plural solid-state image pickup devices formed thereon are integrally combined, and the lens substrate and the sensor substrate are cut in such a manner that each of the cut substrates includes a lenses and solid-state image pickup devices. Other production methods include, for example: a method of fabricating an image pickup unit whereby only lenses are formed on a glass wafer, the glass wafer is cut to have a size suitable for combined use with an individual sensor substrate piece, and combined with an individual image pickup substrate piece that has been cut to have an appropriate size in advance, and is then combined with an image pickup device which had been individualized in advance; a method whereby plural lenses are formed in a mold by using only a resin, the lenses are combined disposed on and combined with a sensor substrate, and cutting the resultant, and a method of fabricating an image pickup unit whereby a lens substrate is cut to have an size appropriate for combination with an individual sensor substrate piece, and is combined with an image pickup substrate piece that has been cut to have an appropriate size in advance.

Hereinafter, in the present specification, each of plural lenses formed on a lens substrate is referred to as "wafer level lens", and a lens group formed on a lens substrate, inclusive of the lens substrate, is referred to as "wafer level lens array".

A conventional wafer level lens array is known which is obtained by dripping a curable resin material on a surface of a flat plate substrate formed of a light-transmissive material such as glass, shaping the resin material into a given shape in a mold, and curing the resin material in this state to form plural lenses (for example, see Japanese Patent No. 3,926,380 and International Publication No. WO 2008/102648). In some cases, a light-shielding region made of a black film, a metal film, or the like is formed at a region other than the lens region of the wafer level lens, or at a portion of the lens, in order to control an amount of light. The light-shielding region is generally formed by applying a curable light-shielding composition or depositing a metal.

Another wafer level lens array is known which is obtained by forming plural holes through a silicon substrate, separately-prepared spherical lens material is disposed at each through hole, fusing the lens material to the substrate by soldering, and polishing the lens material to form plural lenses (see U.S. Pat. No. 6,426,829). The lens obtained by this method may be provided with a black film, a metal film, or the like similar to the above, in order to control an amount of light.

Formation of a light-shielding region by deposition of a metal has problems in that the process is complex, the lens bends after deposition, and light scattering occurs due to reflection by the metal light-shielding film, and further improvements are requested from the viewpoint of both productivity and performance.

In order to exert light-shielding properties, a carbon black-containing black curable composition for use in, for example, black matrices of LCDs is employed for the application. However, provision of sufficient light-shielding properties in the visible light region for use with a lens also causes insufficient light transmittance for a radiation selected from g-line, h-line, i-line, or the like as an exposure light source used for the curing of the curable composition, and, resultantly, inability of the curing to proceed to deep into the film, and peeling of the film during a development process after image-wise exposure.

SUMMARY OF INVENTION

The present invention has been made in view of the above problems, and it is an object of the present invention to provide a black curable composition for a wafer level lens, which is capable of forming a cured film having excellent light-shielding properties and exhibiting excellent curing sensitivity at the time of pattern formation.

A further object of the present invention is to provide a wafer level lens in which the amount of light is appropriately controlled by the presence of a light-shielding film and which is capable of being easily produced.

As a result of intensive studies, the inventors of the present invention have found that the above objects can be achieved by using a pigment dispersion liquid containing a metal-containing inorganic pigment which has excellent transmittance for an ultraviolet region, and which has light shielding properties in a range of from a visible light region to an infrared region. The present invention has been completed based on these findings.

The black curable composition for a wafer level lens according to the present invention includes (A) a metal-containing inorganic pigment, (B) a polymerization initiator, and (C) a polymerizable compound.

Here, the (A) a metal-containing inorganic pigment to be used is preferably titanium black, from the viewpoint of transmittance in the ultraviolet region, and light shielding properties in a range of from a visible light region to an infrared region.

In the black curable composition, the (A) metal-containing inorganic pigment is contained in the form of preferably a pigment dispersion, from the viewpoint of uniformity of the resultant light-shielding film.

The black curable composition for a wafer level lens according to the present invention includes, as a light-shielding material, (A) a metal-containing inorganic pigment, which is preferably titanium black. As a result, the black curable composition for a wafer level lens according to the invention cures with high sensitivity while maintaining light shielding properties, and becomes a black resist having excellent resistance against developer.

It is preferable to further add, to the black curable composition, a desired colorant selected from a pigment dispersion liquid containing an organic pigment or a dye, so as to improve light-shielding performance in a visible light region.

The wafer level lens according to the present invention includes a light-shielding region obtained by curing the black curable composition for a wafer level lens according to the present invention.

According to the present invention, a black curable composition for a wafer level lens is provided which is capable of forming a cured film having excellent light shielding properties, and which exhibits excellent curing sensitivity at the time of pattern formation.

Further, according to the present invention, a wafer level lens is provided with which the amount of light is appropriately controlled by the presence of a light-shielding film, and which is capable of being easily produced.

DESCRIPTION OF EMBODIMENTS

Figure 1:
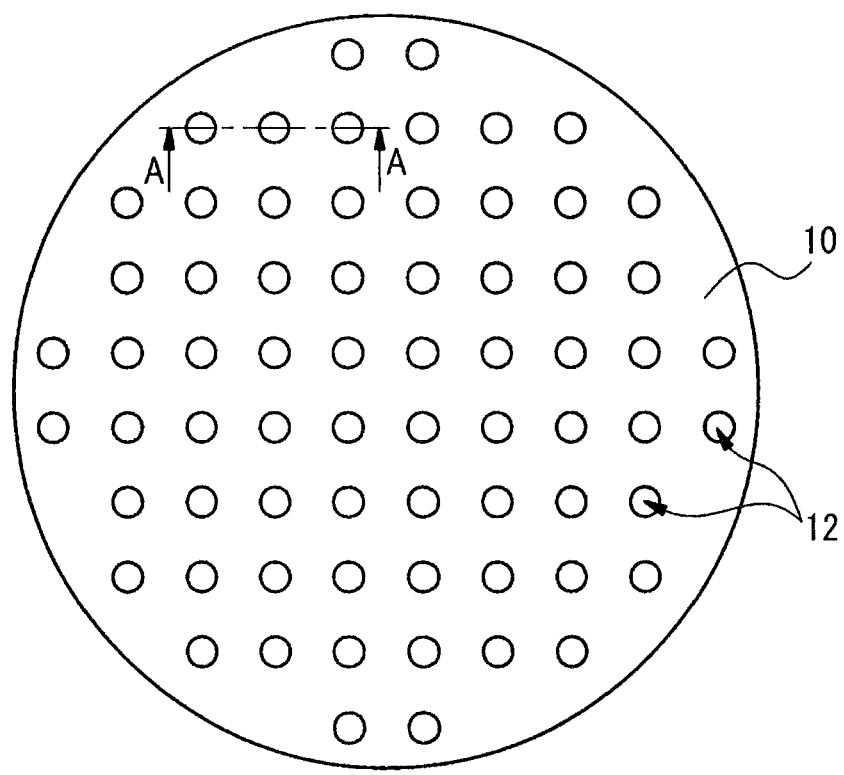
FIG. 1 is a plan view showing an example of the arrangement of wafer level lenses.

A black curable composition of the present invention and a wafer level lens having a light-shielding film formed from the black curable composition are described below in more detail.

<Black Curable Composition>

The black curable composition of the invention includes (A) a metal-containing inorganic pigment, (B) a polymerization initiator, and (C) a polymerizable compound. The black curable composition of the invention may be used for forming a light-shielding film of a wafer level lens. In the following, individual ingredients contained in the black curable composition for a wafer level lens according to the invention are described sequentially.

(A) Metal-Containing Inorganic Pigment

The (A) metal-containing inorganic pigment is selected as a colorant for use in the invention, from the viewpoints of storage stability and safety. The (A) metal-containing inorganic pigment preferably exhibits absorbance in a range of from ultraviolet light to infrared light, in order to exhibit light shielding properties over the range of from ultraviolet light to infrared. Examples of the (A) metal-containing inorganic pigment include a pigment formed of a simple metal, and a pigment formed of a metal compound such as a metal oxide or a metal complex salt.

Specific examples of the metal-containing inorganic pigment include zinc oxide, white lead, lithophone, titanium oxide, chromium oxide, iron oxide, precipitated barium sulfate, barite powder, red lead, red iron oxide, chrome yellow, zinc yellow (zinc yellow 1, zinc yellow 2), ultramarine blue, Prussian blue (potassium iron ferrocyanide), zircon gray, praseodymium yellow, chromium titanium yellow, chromium green, peacock, Victoria green, ferric hexacyanoferrate (unrelated to Prussian blue), vanadium zirconium blue, chromium tin pink, manganese pink, and salmon pink. In addition, examples of black metal-containing inorganic pigments include a metal oxide containing one type of metal element, or two or more types of metal element, selected from the group consisting of Co, Cr, Cu, Mn, Ru, Fe, Ni, Sn, Ti and Ag and metal nitrides containing one type of metal element, or two or more types of metal element, selected from the group consisting of Co, Cr, Cu, Mn, Ru, Fe, Ni, Sn, Ti and Ag. These pigments may be used singly, or in combination of two or more thereof. Carbon black is not included in the scope of the metal-containing inorganic pigment according to the invention since carbon black does not contain a metal.

In particular, for the purpose of exhibiting light shielding properties over a broad wavelength range of from ultraviolet to infrared, plural pigments may be mixed and used instead of using a single pigment.

The metal-containing inorganic pigment is preferably titanium black or a metal pigment of silver and/or tin, from the viewpoint of light shielding properties and curability. The metal-containing inorganic pigment is most preferably titanium black from the viewpoint of light shielding properties in a range of from ultraviolet to infrared.

The term "titanium black" as used herein refers to black particles containing a titanium atom, and is preferably a lower titanium oxide, a titanium oxynitride or the like. The titanium black particles may be surface-modified for the purpose of improving dispersibility, suppressing aggregability or the like, as necessary. Specifically, the titanium black may be coated with silicon oxide, titanium oxide, germanium oxide, aluminum oxide, magnesium oxide or zirconium oxide. Treatment of the titanium black with a water-repellent substance as described in Japanese Patent Application Laid-Open (JP-A) No. 2007-302836 is also permissible.

The titanium black may be used in combination with one of, or two or more of, black pigments such as a composite oxide containing at least one of Cu, Fe, Mn, V, Ni or the like, cobalt oxide, iron oxide, carbon black, or aniline black, for the purpose of controlling, for example, dispersibility or coloring properties. In this case, the proportion of titanium black particles to the total amount of pigments may be 50% by mass or higher.

Examples of commercially available products of titanium black include titanium black 10S, 12S, 13R, 13M, 13M-C, 13R and 13R-N (tradenames, manufactured by Mitsubishi Materials Corporation), and TILACK D (tradename, manufactured by Ako Kasei Co., Ltd.).

Examples of methods of producing titanium black include, but are not limited to, a method of heating and reducing a mixture of titanium dioxide and metallic titanium under a reducing atmosphere (JP-A No. 49-5432); a method of reducing, under a hydrogen-containing reducing atmosphere, ultrafine titanium dioxide obtained by high-temperature hydrolysis of titanium tetrachloride (JP-A No. 57-205322); a method of reducing titanium dioxide or titanium hydroxide at high temperatures in the presence of ammonia (JP-A No. 60-65069 and JP-A No. 61-201610); and a method of depositing a vanadium compound on titanium dioxide or titanium hydroxide, and reducing the resultant at high temperatures in the presence of ammonia (JP-A No. 61-201610).

The average primary particle size of the titanium black particles is not particularly limited, and is preferably from 3 nm to 2000 nm, more preferably from 10 nm to 500 nm, and most preferably from 10 nm to 100 nm, from the viewpoint of dispersibility and coloring properties.

The specific surface area of the titanium black is not particularly limited, and the specific surface area of the titanium black as measured by a BET method is, in usual cases, preferably from about 5 to about 150 $m^2/g$, and particularly preferably from about 20 to about 100 $m^2/g$, in order that the titanium black exhibits a desired water repellency after being treated with a water-repellent.

The (A) metal-containing inorganic pigment according to the invention, of which typical example is titanium black, has an average primary particle diameter of preferably from 3 nm to 0.01 mm. The average primary particle diameter of the (A) metal-containing inorganic pigment is preferably in the range of from 10 nm to 1 μm from the viewpoint of dispersibility, light shielding properties, and sedimentation properties over time.

The (A) metal-containing inorganic pigments in the black curable composition of the invention may include only a single metal-containing inorganic pigment or a combination of two or more metal-containing inorganic pigments. As described below, at least one organic pigment and/or at least one dye may be additionally used if desired, for the purpose of, for example, controlling light shielding properties.

The content of the (A) metal-containing inorganic pigment in the black curable composition is preferably in the range of from 5 to 70% by mass, and more preferably from 10 to 50% by mass, relative to the total mass of the composition.

The incorporation of the (A) metal-containing inorganic pigment into the black curable composition is preferably conducted by adding a pigment dispersion in which a metal-containing inorganic pigment is already dispersed with a known pigment dispersant, from the viewpoint of uniformity of the resultant composition. The pigment dispersant (hereinafter simply referred to as "dispersant" in some cases) to be used may be appropriately selected from, for example, known pigment dispersants and surfactants.

The pigment dispersant is preferably a high-molecular-weight compound having a heterocyclic ring in a side chain thereof. The high-molecular-weight compound is preferably a polymer containing a polymerization unit derived from a monomer represented by General Formula (1) described in Japanese Patent Application Laid-Open (JP-A) No. 2008-266627, or a monomer of maleimide or a maleimide derivative. Pigment dispersants of these types are detailed in paragraph numbers [0020] to [0047] of JP-A No. 2008-266627, and the dispersants described therein is also applicable to the present invention.

The pigment dispersant may be arbitrarily selected from known compounds besides those described above, and commercially available dispersants and surfactants may be used. Specific examples of commercially available products that can be used as dispersants include cationic surfactants such as organosiloxane polymer KP341 (tradename, manufactured by Shin-Etsu Chemical Co., Ltd.), (meth)acrylic (co)polymer POLYFLOW No. 75, No. 90 and No. 95 (tradename, all manufactured by Kyoeisha Chemical Co., Ltd.), and W001 (tradename, available from Yusho Co., Ltd.); nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethyleneglycol dilaurate, polyethyleneglycol distearate, and sorbitan fatty acid esters; anionic surfactants such as W004, W005, and W017 (tradenames, all available from Yusho Co., Ltd.); polymer dispersants such as EFKA-46, EFKA-47, EFKA-47EA, EFKA POLYMER 100, EFKA POLYMER 400, EFKA POLYMER 401 and EFKA Polymer 450 (tradenames, all manufactured by BASF Japan Ltd.) and DISPERSE AID 6, DISPERSE AID 8, DISPERSE AID 15 and DISPERSE AID 9100 (tradenames, all manufactured by San Nopco LTD.); various SOLSPERSE dispersants such as SOLSPERSE 3000, 5000, 9000, 12000, 13240, 13940, 17000, 24000, 26000, 28000, 32000, and 36000 (tradenames, all manufactured by The Lubrizol Japan Corporation); and ADEKA PLURONIC L31, F38, L42, L44, L61, L64, F68, L72, P95, F77, P84, F87, P94, 101, P103, F108, L121, and P-123 (tradenames, all manufactured by Asahi Denka Kogyo K.K.), IONET S-20 (Sanyo Chemical Industries, Ltd.), DISPERBYK 101, 103, 106, 108, 109, 111, 112, 116, 130, 140, 142, 162, 163, 164, 166, 167, 170, 171, 174, 176, 180, 182, 2000, 2001, 2050, and 2150 (tradenames, all manufactured by BYK Chemie), and BYK-161 (tradename, manufactured by BYK Chemie).

Other preferable examples of the dispersant include oligomers or polymers having a polar group at a molecular terminal or at a side chain thereof, such as acrylic copolymers.

From the viewpoint of dispersibility, developability, and sedimentation properties, a resin having a polyester chain in a side chain is preferable as a dispersant. In particular, a resin having a polyester chain in a side chain is preferable from the viewpoint of dispersibility. Further, a resin further having an acid group is preferable from the viewpoint of dispersibility and resolution. The acid group has a pKa value of preferably 6 or less, and is particularly preferably an acid group derived from carboxylic acid, sulfonic acid, or phosphoric acid, from the viewpoint of adsorption properties.

Among them, a resin having a polycaprolactone chain (as a polyester chain) at a side chain thereof, and also having a carboxylic acid group in a molecule thereof is the most preferable dispersant, from the viewpoint of solubility in the dispersion liquid, dispersibility, and developability.

When a pigment dispersion is prepared, the content of dispersant is preferably in the range of from 1% by mass to 90% by mass, and more preferably from 3% by mass to 70% by mass, relative to the total solids mass of colorants (including black pigments and other colorants) contained in the pigment dispersion.

(B) Polymerization Initiator

The black curable composition of the invention includes a polymerization initiator.

The polymerization initiator in the black curable composition of the invention is a compound that is degraded by light or heat to initiate and promote the polymerization of the below-described polymerizable compound. The polymerization initiator preferably has absorption in a wavelength region of 300 nm to 500 nm.

Specifically, examples of the polymerization initiator include organic halogenated compounds, oxydiazole compounds, carbonyl compounds, ketal compounds, benzoin compounds, organic peroxide compounds, azo compounds, coumarin compounds, azide compounds, metallocene compounds, organic boric acid compounds, disulfonic acid compounds, oxime ester compounds, onium salt compounds, acyl phosphine (oxide) compounds, and hexaarylbiimidazole compounds. In particular, oxime ester compounds and hexaarylbiimidazole compounds are preferable from the viewpoints of residues and adhesion properties.

Examples of preferable oxime ester compounds include known compounds that are known as photopolymerization initiators for photosensitive compositions such as for applications in electronic parts. Tie oxime ester compound for use may be selected from, for example, the compounds described in JP-A No. 57-116047, JP-A No. 61-24558, JP-A No. 62-201859, JP-A No. 62-286961, JP-A No. 7-278214, JP-A No. 2000-80068, JP-A No. 2001-233842, JP-A No. 2004-534797, JP-A No. 2002-538241, JP-A No. 2004-359639, JP-A No. 2005-97141, JP-A No. 2005-220097, WO2005-080337A1, JP-A No. 2002-519732, JP-A No. 2001-235858, and JP-A No. 2005-227525.

In general, oxime ester compounds exhibit low sensitivity since absorption thereof in near-ultraviolet regions, for example at a wavelength of 365 nm or 405 nm, is small. However, it is known that the sensitivity of oxime ester compounds is improved by sensitizers through increase in sensitivity to light in near-ultraviolet regions.

Oxime ester compounds that exhibit small absorption in a wavelength region of from 380 nm to 480 nm and that exhibit high decomposition efficiency are preferable. However, oxime ester compounds that exhibit large absorption in a wavelength region of from 380 nm to 480 nm are also preferable if the compounds are decomposed by light so that the absorption thereof in the wavelength region is decreased (the side products have absorption at a shorter wavelength).

In the invention, among oxime ester compounds, compounds represented by the following Formula (a) are preferable from the viewpoints of sensitivity, stability over time, and coloring during post-heating. Preferable examples also include IRGACURE OXE-01 and OXE-02 (tradenames) manufactured by BASF Japan Ltd.

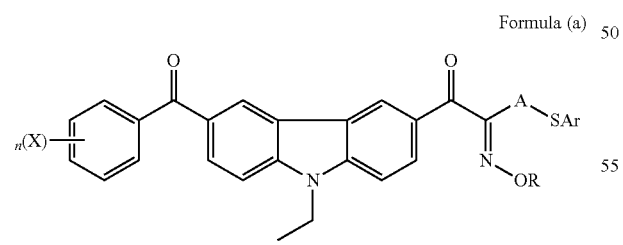

Formula (a)

In Formula (a), R and X each independently represent a monovalent substituent; A represents a divalent organic group; Ar represents an aryl group; and n represents an integer of from 1 to 5.

From the viewpoint of increasing sensitivity, R represents preferably an acyl group, preferable specific examples of which include an acetyl group, a propionyl group, a benzoyl group, and a toluoyl group.

From the viewpoints of increasing sensitivity and suppressing coloration during post-heating or over time, A represents preferably an unsubstituted alkylene group, an alkylene group substituted by at least one alkyl group (such as a methyl group, an ethyl group, a tert-butyl group, or a dodecyl group), an alkylene group substituted by at least one alkenyl group (such as a vinyl group or an allyl group), or an alkylene group substituted by an aryl group (such as a phenyl group, a p-tolyl group, a xylyl group, a cumenyl group, a naphthyl group, an anthryl group, a phenanthryl group, or a styryl group).

From the viewpoint of increasing sensitivity and suppressing coloration during post-heating or over time, Ar represents preferably a substituted or unsubstituted phenyl group. In the case of a substituted phenyl group, preferable examples of the substituent include a halogen group such as a fluorine atom, a chlorine atom, a bromine atom, or an iodine atom.

From the viewpoint of improving solubility in solvents and absorption efficiency in longer-wavelength regions, X represents preferably an alkyl group which may have a substituent, an aryl group which may have a substituent, an alkenyl group which may have a substituent, an alkynyl group which may have a substituent, an alkoxy group which may have a substituent, an aryloxy group which may have a substituent, an alkylthioxy group which may have a substituent, an arylthioxy group which may have a substituent, or an amino group which may have a substituent. In Formula (a), n represents preferably an integer of from 1 to 2. Specific examples of oxime ester compounds are shown below.

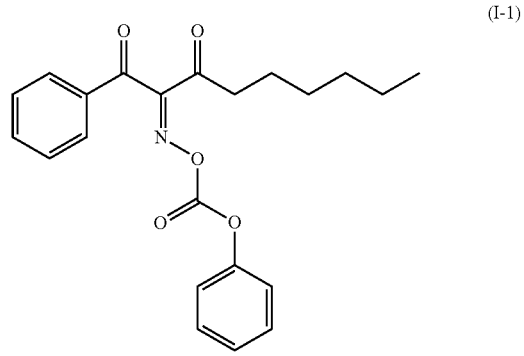

(I-1)

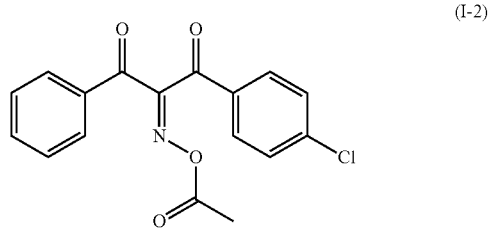

(I-2)

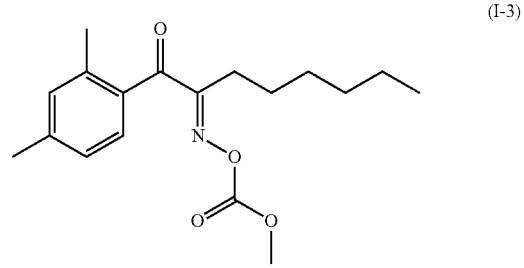

(I-3)

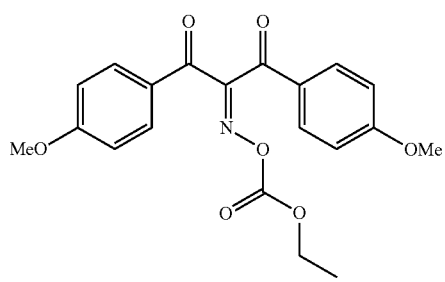
(I-4)
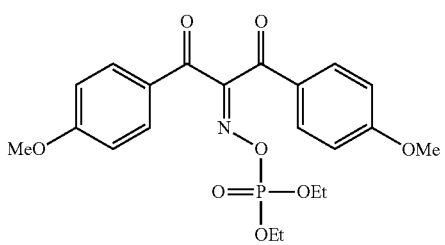
(I-9)
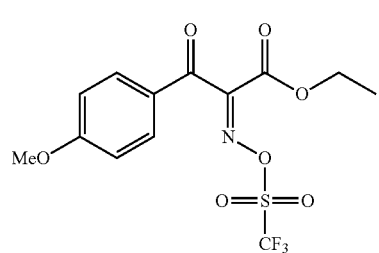
(I-5)
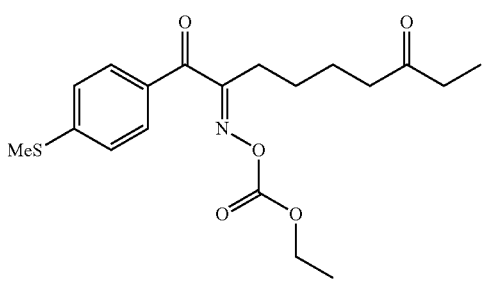
(I-10)
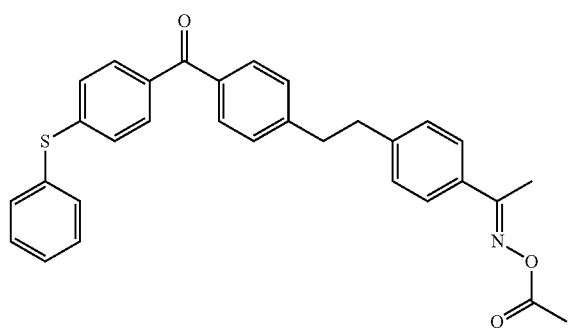
(I-6)
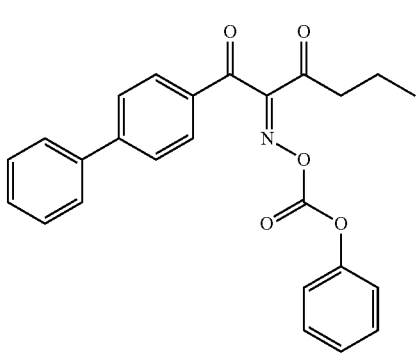
(I-11)
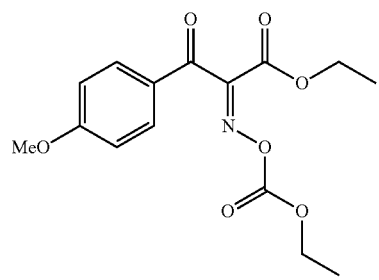
(I-7)
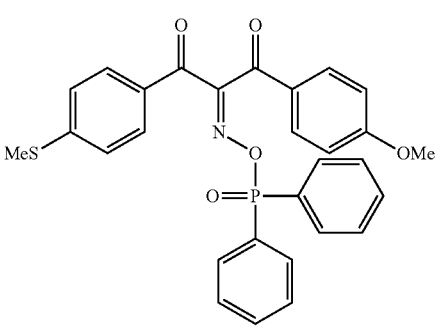
(I-12)
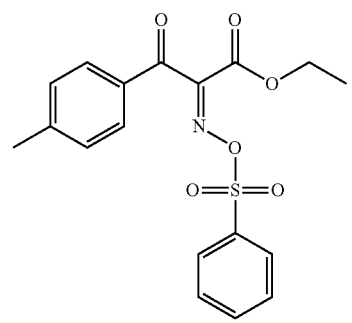
(I-8)
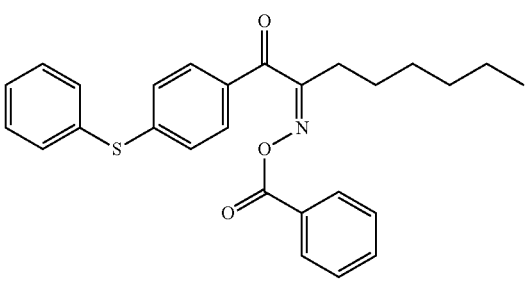
(I-13)

(I-14)
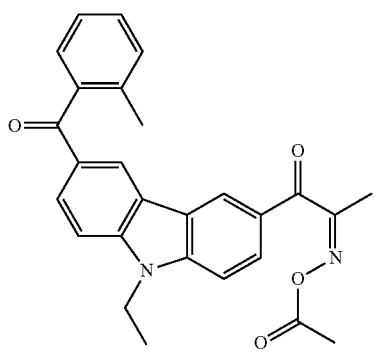
(I-19)
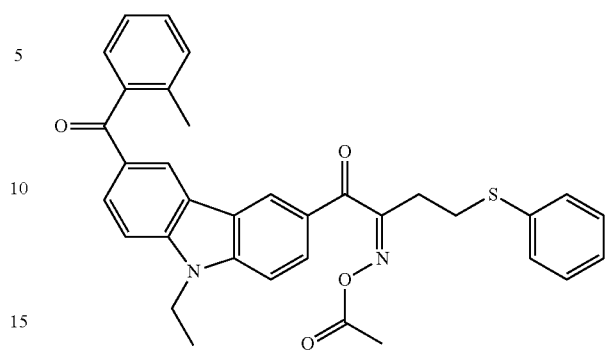
(I-15)
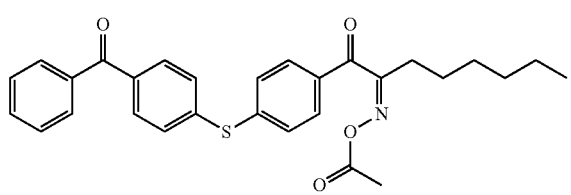
(I-20)
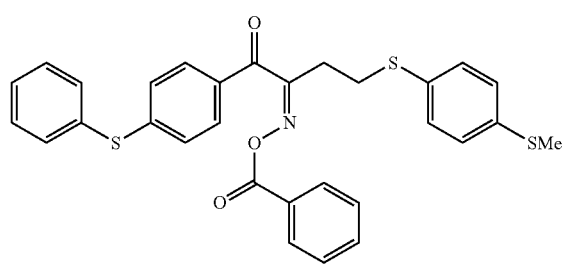
(I-16)
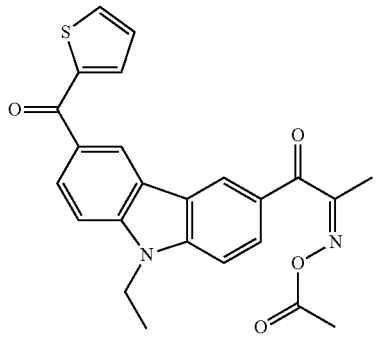
(I-21)
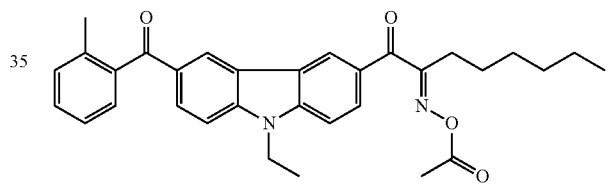
(I-17)
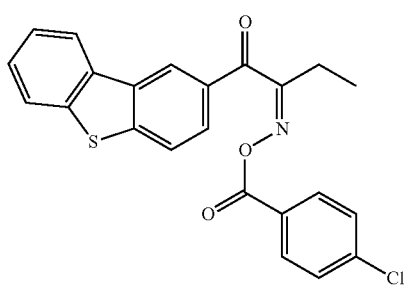
(I-22)
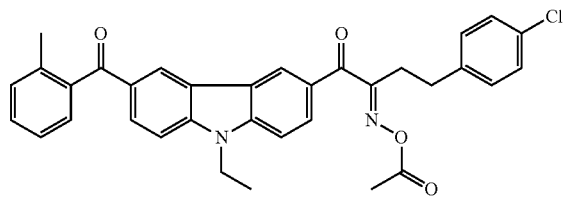
(I-18)
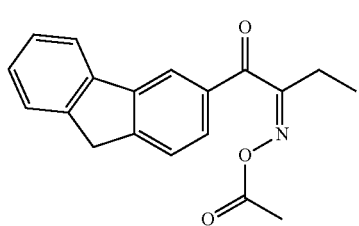
(I-23)
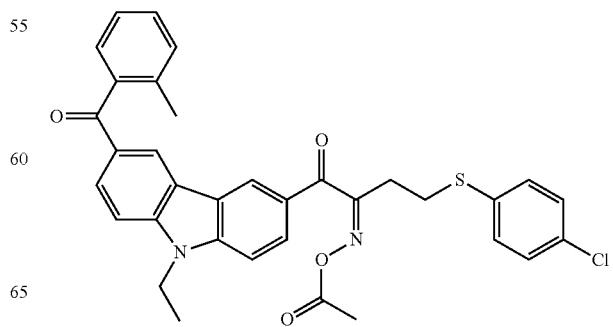

| Polymerization initiator | |
|---|---|
| Compound No. | Structure |
| Compound I-24 | 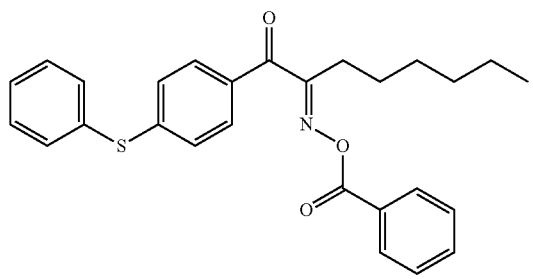 [SMILES: CCCCCC/C(=N\OC(=O)c1ccccc1)C(=O)c1ccc(Sc2ccccc2)cc1]<br>IRGACURE OXE01 (manufactured by BASF Japan Ltd.) |
| Compound I-25 | 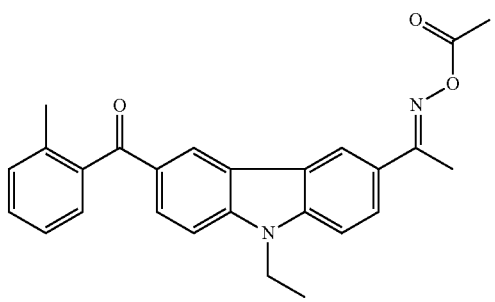 [SMILES: CCn1c2ccc(C(=O)c3ccccc3C)cc2c2cc(/C(C)=N/OC(C)=O)ccc21]<br>IRGACURE OXE02 (manufactured by BASF Japan Ltd.) |
| Compound I-26 | 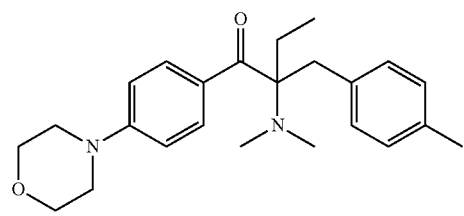 [SMILES: CCC(Cc1ccc(C)cc1)(C(=O)c1ccc(N2CCOCC2)cc1)N(C)C]<br>IRGACURE 379 (manufactured by BASF Japan Ltd.) |
| Compound I-27 | 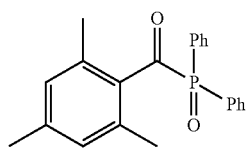 [SMILES: Cc1cc(C)c(C(=O)P(=O)(c2ccccc2)c2ccccc2)c(C)c1]<br>DAROCUR TPO (manufactured by BASF Japan Ltd.) |
| Compound I-28 | 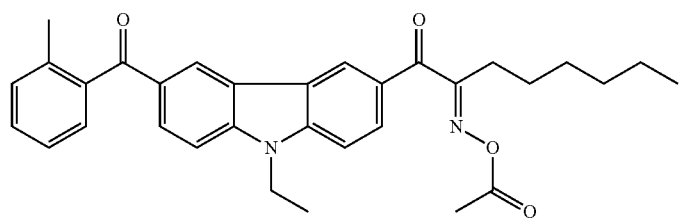 [SMILES: CCCCCC/C(=N\OC(C)=O)C(=O)c1ccc2c(c1)c1cc(C(=O)c3ccccc3C)ccc1n2CC] |

| Polymerization initiator | |
|---|---|
| Compound No. | Structure |
| Compound I-29 | 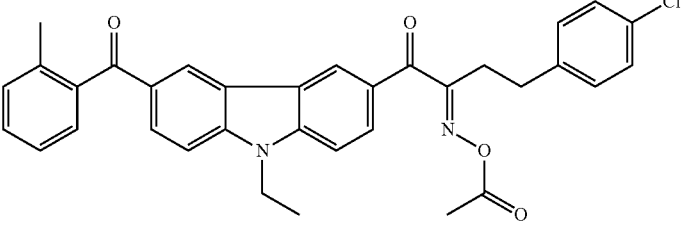 |

Examples of hexaarylbiimidazole compounds include various compounds described in JP-B No. 6-29285, U.S. Pat. No. 3,479,185, U.S. Pat. No. 4,311,783, and U.S. Pat. No. 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methyl phenyl)-4,4',5,5'-tetraphenylbiimidazole, and 2,2'-bis(o-trifluorophenyl)-4,4',5,5'-tetraphenyl biimidazole.

The polymerization initiator in the invention may be used singly, or in combination of two or more thereof.

The content of the (B) polymerization initiator in the black curable composition of the invention may be in the range of from 0.1 to 30% by mass, more preferably from 1 to 25% by mass, and particularly preferably from 2 to 20% by mass, relative to the total amount of solids of the black curable composition.

(C) Polymerizable Compound

The black curable composition of the invention includes a polymerizable compound. The (C) polymerizable compound is preferably a compound having at least one addition-polymerizable ethylenic unsaturated group and having a boiling point of 100° C. or higher at normal pressure.

Examples of the compound having at least one addition-polymerizable ethylenic unsaturated group and having a boiling point of 100° C. or higher at a normal pressure include monofunctional acrylates and methacrylates such as polyethylene glycol mono(meth)acrylate, polypropylene glycol mono(meth)acrylate, and phenoxyethyl (meth)acrylate; and polyfunctional acrylates and methacrylates such as polyethylene glycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol hexa(meth)acrylate, hexanediol (meth)acrylate, trimethylolpropane tri(acryloyloxypropyl)ether, tri(acryloyloxyethyl)isocyanurate, monomers obtained by adding ethylene oxide and/or propylene oxide to a polyfunctional alcohol such as glycerin or trimethylolethane and thereafter (meth)acrylating the resultant product, poly(meth)acrylated products of pentaerythritol or dipentaerythritol, urethane acrylates described in Japanese Examined Patent Application Publication (JP-B) Nos. 48-41708 and 50-6034 and JP-A No. 51-37193, polyester acrylates described in JP-A No. 48-64183 and JP-B Nos. 49-43191 and 52-30490, and epoxy acrylates each of which is a reaction product of an epoxy resin and (meth)acrylic acid.

Further examples of polymerizable compounds that can be used include photosetting monomers and oligomers described in Journal of the Adhesive Society of Japan, Vol. 20, No. 7, p. 300-308.

Further, compounds of General Formulae (1) and (2) of JP-A No. 10-62986, which are described together with specific examples thereof and obtained by adding ethylene oxide and/or propylene oxide to polyfunctional alcohols, may be used as polymerizable compounds.

Among them, the polymerizable compound is preferably dipentaerythritol penta(meth)acrylate, dipentaerythritol hexa(meth)acrylate, or dipentaerythritol having 5 or 6 chains each of which is composed of at least one ethyleneglycol residue or propyleneglycol residue and has (meth)acryloyl group at a terminal thereof. It is also permissible to use, as the polymerizable compound, an oligomerized form of any of these compounds. A succinic acid-modified monomer of dipentaerythritol pentaacrylate is also preferable.

Also preferable are urethane acrylates such as those described in JP-B No. 48-41708, JP-A No. 51-37193, JP-B No. 2-32293 and JP-B No. 2-16765, and urethane compounds having ethyleneoxide skeleton and described in JP-B Nos. 58-49860, 56-17654, 62-39417 and 62-39418. Photopolymerizable compositions having excellent photoresponsive speed can also be obtained using addition-polymerizable compounds having an amino or sulfide structure in a molecule thereof, which are disclosed in JP-A Nos. 63-277653, 63-260909 and 01-105238. Commercially available products thereof include: urethane oligomers UAS-10 and UAB-140 (both of which are tradenames, manufactured by Sanyo-Kokusaku pulp Co., Ltd.); UA-7200 (tradename, manufactured by Shin-Nakamura Chemical Co., Ltd.); DPHA-40H (tradename, manufactured by Nippon Kayaku Co., Ltd.); and UA-306H, UA-306T, UA-306I, AH-600, T-600 and AI-600 (all of which are tradenames, manufactured by Kyoei Co., Ltd.).

Ethylenic unsaturated compounds having an acid group are also preferable, and commercially-available products thereof include TO-756 (tradename, manufactured by Toagosei Co., Ltd.), which is a trifunctional acrylate containing a carboxyl group, and TO-1382 (tradename, manufactured by Toagosei Co., Ltd.), which is a pentafunctional acrylate containing a carboxyl group. The polymerizable compound used in the invention is still more preferably a tetra- or higher-functional acrylate compound The polymerizable compound may be used singly or in combination of two or more thereof. When two or more polymerizable compounds are used in combination, each polymerizable compound is preferably a tri- or higher-functional acrylate compound. A combination of at least one tri- or higher-functional acrylate compound and at least one ethylenic unsaturated compound having an acidic group is also preferable. The content of polymerizable compound in the black curable composition (the total content of polymerizable compounds in a case in which the black curable composition contains two or more polymerizable compounds) is preferably in the range of from 3 to 55 parts by mass, and more preferably from 10 to 50 parts by mass, per 100 parts by mass of the total solids of the black curable composition. When the content of polymerizable compound (B) is within the above-specified range, curing reaction proceeds sufficiently.

<Organic Solvent>

The black curable composition of the invention may generally include an organic solvent. The organic solvent is basically not particularly limited as long as the organic solvent has satisfactory properties in terms of the solubility of components and coating properties of the polymerizable composition. The organic solvent may be selected in consideration of, preferably, the solubility of the binder polymer, coating properties, and safety.

Examples of the organic solvent include:

esters such as ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, alkyl oxyacetates such as methyl oxyacetates, ethyl oxyacetates, and butyl oxyacetates (such as methyl methoxyacetate, ethyl methoxyacetate, butyl methoxyacetate, methyl ethoxyacetate, and ethyl ethoxyacetate), alkyl 3-oxypropionates such as methyl 3-oxypropionates and ethyl 3-oxypropionates (such as methyl 3-methoxypropionate, ethyl 3-methoxypropionate, methyl 3-ethoxypropionate, and ethyl 3-ethoxypropionate), alkyl 2-oxypropionates such as methyl 2-oxypropionates, ethyl 2-oxypropionates, and propyl 2-oxypropionates (such as methyl 2-methoxypropionate, ethyl 2-methoxypropionate, propyl 2-methoxypropionate, methyl 2-ethoxypropionate, and ethyl 2-ethoxypropionate), methyl 2-oxy-2-methylpropionates and ethyl 2-oxy-2-methylpropionates (such as methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate;

ethers such as diethyleneglycol dimethyl ether, tetrahydrofuran, ethyleneglycol monomethyl ether, ethyleneglycol monoethyl ether, methyl cellosolve acetate, ethyl cellosolve acetate, diethyleneglycol monomethyl ether, diethyleneglycol monoethyl ether, diethyleneglycol monobutyl ether, propyleneglycol monomethyl ether, propyleneglycol monomethyl ether acetate, propyleneglycol monoethyl ether acetate, and propyleneglycol monopropyl ether acetate;

ketones such as methyl ethyl ketone, cyclohexanone, 2-heptanone, and 3-heptanone; and aromatic hydrocarbons such as toluene and xylene.

A mixture of two or more of the above organic solvents is also preferable from the viewpoint of improving the solubility of the binder polymer and the coating surface properties. In this case, a mixture solution composed of two or more selected from methyl 3-ethoxypropionate, ethyl 3-ethoxypropionate, ethyl cellosolve acetate, ethyl lactate, diethyleneglycol dimethyl ether, butyl acetate, methyl 3-methoxypropionate, 2-heptanone, cyclohexanone, ethyl carbitol acetate, butyl carbitol acetate, propyleneglycol methyl ether, or propyleneglycol methyl ether acetate is preferable.

From the viewpoint of coating properties, the content of organic solvent in the black curable composition of the invention is preferably such that the total solids concentration of the black curable composition is from 5 to 80% by mass, more preferably from 5 to 60% by mass, and particularly preferably from 10 to 50% by mass.

(D) Other Additives

The black curable composition of the invention may include, in addition to the above-mentioned essential ingredients (A) to (C) and an optional pigment dispersant, various additives in accordance with desired applications.

(D-1) Binder Polymer

If necessary, the black curable composition may also include a binder polymer, for the purpose of, for example, improving film properties. The binder is preferably a linear organic polymer, which may be freely selected from known linear organic polymers. In order to enable development with water or a weakly alkaline aqueous solution, it is preferable to select a linear organic polymer that is soluble or swellable in water or a weakly alkaline aqueous solution. The linear organic polymer may be selected and used in consideration of not only its function as a film-forming agent, but also its function of allowing development with a developer such as water, a weakly alkaline aqueous solution or an organic solvent.

For example, use of a water-soluble organic polymer enables water development. Examples of the linear organic polymer include radical polymerization products having a carboxylic acid group at a side chain thereof, such as those described in JP-A No. 59-44615, JP-B Nos. 54-34327, 58-12577 and 54-25957, and JP-A Nos. 54-92723, 59-53836 and 59-71048. Specific examples thereof include a resin that is a homopolymer of a carboxyl group-containing monomer, a resin that is a copolymer of monomers including a carboxyl group-containing monomer, a resin obtained by hydrolysis, half-esterification or half-amidation of acid anhydride units of a homopolymer of an acid anhydride-containing monomer, a resin obtained by hydrolysis, half-esterification or half-amidation of a copolymer of monomers including an acid anhydride-containing monomer, and an epoxy acrylate obtained by modifying an epoxy resin with at least one unsaturated monocarboxylic acid and at least one acid anhydride. Examples of the carboxyl group-containing monomer include acrylic acid, methacrylic acid, itaconic acid, crotonic acid, maleic acid, fumaric acid, and 4-carboxylstyrene. Examples of the acid anhydride-containing monomer include maleic anhydride.

Further examples include an acidic cellulose derivative having a carboxylic acid group at a side chain thereof, and a product obtained by adding a cyclic acid anhydride to a hydroxyl group-containing polymer.

Acid group-containing urethane binder polymers, such as those described in JP-B Nos. 07-120040, 07-120041, 07-120042, and 08-12424, JP-A Nos. 63-287944, 63-287947, 01-271741 and Japanese Patent Application No. 10-116232, are advantageous in terms of compatibility with low exposure amount due to excellent strength thereof.

Acetal-modified polyvinyl alcohol binder polymers having acid groups, such as those described in European Patent Nos. 993966 and 1204000 and JP-A No. 2001-318463, are preferable in that they provide an excellent balance between film strength and developability. Examples of water-soluble linear organic polymers further include polyvinyl pyrrolidone and polyethylene oxide. An alcohol-soluble nylon or a polyether of 2,2-bis-(4-hydroxyphenyl)-propane and epichlorohydrin is also useful in terms of increasing the strength of a cured film.

Among them, a copolymer of benzyl (meth)acrylate, (meth)acrylic acid, and, optionally, one or more other addition-polymerizable vinyl monomers, a copolymer of allyl (meth)acrylate, (meth)acrylic acid, and, optionally, one or more other addition-polymerizable vinyl monomers, and a copolymer of styrene, methyl methacrylate, and methacrylic acid, are preferable in that they provide excellent balance between film strength, sensitivity and developability.

A binder polymer used in the black curable composition has a weight average molecular weight of preferably 5,000 or more, more preferably from 10,000 to 300,000, and has a number average molecular weight of preferably 1,000 or more, more preferably from 2,000 to 250,000. The polydispersity (weight average molecular weight/number average molecular weight) thereof is preferably 1 or higher, and more preferably in the range of from 1.1 to 10.

The binder polymer may be any of a random polymer, a block polymer, or a graft polymer.

The binder polymer used in the invention may be synthesized by a conventional known method. Examples of the solvent used in the synthesis of the binder polymer include tetrahydrofuran, ethylene dichloride, and cyclohexanone. The solvent may be used singly, or in combination of two or more thereof.

Examples of the radical polymerization initiator used in the synthesis of the binder polymer to be contained in the black curable composition include known compounds such as azo-based initiators and peroxide initiators.

Incorporation of an alkali-soluble resin having a double bond at a side chain, among usable binder polymers, improves both of curability of exposed portions and alkali developability of unexposed portions.

The alkali-soluble binder polymer having a double bond at a side chain optionally used in the invention has, in the structure thereof, an acid group for imparting alkali-solubility to the resin, and at least one unsaturated double bond, so as to improve various properties such as removability of non-image portions. Binder resins having such a partial structure are specifically described in JP-A No. 2003-262958, and the compounds described therein may be used in the invention.

The weight average molecular weight of the binder polymer used in the black curable composition of the invention is preferably in the range of from 30,000 to 300,000, more preferably from 35,000 to 250,000, still more preferably from 40,000 to 200,000, and particularly preferably from 45,000 to 100,000, from the viewpoints of developability and pattern detachment inhibition during development.

In addition, the weight average molecular weight of the binder polymer may be measured, for example, with GPC.

The content of the binder polymer relative to the total amount of solids of the black curable composition of the invention is preferably in the range of from 0.1 to 7.0% by mass. From the viewpoint of achieving both of pattern detachment inhibition and inhibition of generation of development residue, the content of the binder polymer relative to the total amount of solids of the black curable composition is more preferably in the range of from 0.3 to 6.0% by mass, and still more preferably from 1.0 to 5.0% by mass.

(D-2) Other Colorants

In the invention, the black curable composition may further include a colorant other than metal-containing inorganic pigments, such as a known organic pigment or dye, in order to obtain desired light shielding properties.

Examples of colorants that may additionally be used include organic pigment such as the pigments described in paragraphs [0030] to [0044] of JP-A No. 2008-224982, and pigments obtained by replacing at least one Cl substituent of C. I. Pigment Green 58 or C. I. Pigment Blue 79 by OH. Among them, preferable pigments include those listed below. However, the invention is not limited thereto.

C. I. Pigment Yellow 11, 24, 108, 109, 110, 138, 139, 150, 151, 154, 167, 180, 185, C. I. Pigment Orange 36, 38, 62, 64, C. I. Pigment Red 122, 150, 171, 175, 177, 209, 224, 242, 254, 255

C. I. Pigment Violet 19, 23, 29, 32,

C. I. Pigment Blue 15:1, 15:3, 15:6, 16, 22, 60, 66,

C. I. Pigment Green 7, 36, 37, 58

C. I. Pigment Black 1

There is no particular limitation on a dye optionally used as a colorant in the invention, and known dyes may be appropriately selected and used. Examples thereof include dyes described in JP-A No. 64-90403, JP-A No. 64-91102, JP-A No. 1-94301, JP-A No. 6-11614, Japanese Patent No. 2592207, the specification of U.S. Pat. No. 4,808,501, the specification of U.S. Pat. No. 5,667,920, the specification of U.S. Pat. No. 5,059,500, JP-A No. 5-333207, JP-A No. 6-35183, JP-A No. 6-51115, JP-A No. 6-194828, JP-A No. 8-211599, JP-A No. 4-249549, JP-A No. 10-123316, JP-A No. 11-302283, JP-A No. 7-286107, JP-A No. 2001-4823, JP-A No. 8-15522, JP-A No. 8-29771, JP-A No. 8-146215, JP-A No. 11-343437, JP-A No. 8-62416, JP-A No. 2002-14220, JP-A No. 2002-14221, JP-A No. 2002-14222, JP-A No. 2002-14223, JP-A No. 8-302224, JP-A No. 8-73758, JP-A No. 8-179120, and JP-A No. 8-151531.

In terms of chemical structures, pyrazole azo dyes, anilino azo dyes, triphenylmethane dyes, antraquinone dyes, anthrapyridone dyes, benzylidene dyes, oxonol dyes, pyrazolotriazole azo dyes, pyridone azo dyes, cyanine dyes, phenothiazine dyes, pyrrolopyrazole azomethine dyes, xanthene dyes, phthalocyanine dyes, benzopyran dyes, indigo dyes or the like may be used.

The combination of at least one metal-containing inorganic pigment and at least one other colorant contained in the black curable composition of the invention is preferably a combination of a titanium black pigment with at least one organic pigment selected from the group consisting of an orange pigment, a red pigment, and a violet pigment, and most preferably a combination of a titanium black pigment with a red pigment, from the viewpoint of achieving both of curability and light shielding properties.

The orange pigment, the red pigment, or the violet pigment, which is optionally used in combination with the titanium black pigment, may be appropriately selected from, for example, various pigments belonging to the C. I. Pigment Orange series pigment, C. I. Pigment Red series pigment, and C. I. Pigment Violet series pigment described above, in accordance with desired light shielding properties. From the viewpoint of improving light shielding properties, preferable examples include C. I. Pigment Violet 29, C. I. Pigment Orange 36, 38, 62, and 64, and C. I. Pigment Red 177, 254, and 255.

(D-3) Sensitizer

The black curable composition may include a sensitizer for the purpose of improvement in radical generation efficiency of the polymerization initiator and/or shifting, toward a longer wavelength side, a wavelength at which black curable composition is sensitive.

The sensitizer optionally used in the invention sensitizes the polymerization initiator that is used together, preferably by an electron transfer mechanism or an energy transfer mechanism.

Preferable examples of the sensitizer include compounds described in paragraphs [0085] [0098] of JP-A No. 2008-214395.

From the viewpoints of sensitivity and storage stability, the content of the sensitizer is preferably from 0.1 to 30% by mass, more preferably from 1 to 20% by mass, and still more preferably from 2 to 15% by mass, relative to the total mass of the solids of the black curable composition.

(D-4) Polymerization Inhibitor

It is preferable to incorporate a small amount of a polymerization inhibitor into the black curable composition, in order to prevent the unnecessary thermal polymerization of the polymerizable compound during the production or storage of the composition. A known thermal polymerization inhibitor may be used as the polymerization inhibitor, and specific examples thereof include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene bis(4-methyl-6-t-butylphenol), and N-nitrosophenylhydroxyamine cerous salt.

The content of thermal polymerization inhibitor is preferably in the range of about from 0.01 to about 5% by mass relative to the total amount of solids of the black curable composition.

Further, if necessary, a higher fatty acid or a derivative thereof, such as behenic acid or behenamide, may be incorporated into the coating liquid such that the higher fatty acid derivative localizes on the surface of a coating film during drying after coating, in order to prevent polymerization inhibition due to oxygen. The content of higher fatty acids and higher fatty acid derivatives is preferably in the range of from about 0.5 to about 10% by mass relative to the total solids content.

(D-5) Adhesion Promoter

An adhesion promoter may be incorporated into the black curable composition in order to improve adhesion to a hard surface such as a support. Examples of the adhesion promoter include a silane coupling agent and a titanium coupling agent.

Examples of the silane coupling agent include γ-methacryloxypropyltrimethoxysilane, γ-methacryloxypropyltriethoxysilane, γ-methacryloxypropyldimethoxymethylsilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane. Among them, γ-methacryloxypropyltrimethoxysilane is preferable.

The content of adhesion promoter is preferably from 0.5 to 30% by mass, and more preferably from 0.7 to 20% by mass, relative to the total amount of solids of the black curable composition.

Further, when the black curable composition of the invention is used in the production of a wafer level lens on a glass substrate, it is preferable to add the adhesion promoter from the viewpoint of improving sensitivity.

(D-6) Surfactant

Various surfactants may be incorporated into the black curable composition of the invention, with a view to further improving the coating properties. Examples of surfactants that may be used include fluorosurfactants, nonionic surfactants, cationic surfactants, anionic surfactants, and silicone surfactants.

In particular, the incorporation of a fluorosurfactant into the black curable composition of the invention further improves the liquid properties (particularly, fluidity) of a coating liquid formed from the black curable composition, and further improves the uniformity of the coating thickness and liquid saving properties.

Specifically, in a case in which a film is formed using a coating liquid in which a black curable composition containing a fluorosurfactant is used, wettability on a surface to be coated is improved due to decreased interfacial tension between the surface to be coated and the coating liquid, as a result of which the coating properties on the surface to be coated is improved. Therefore, the incorporation of a fluorosurfactant is effective in that a film having a substantially uniform thickness and a reduced thickness variation can be favorably formed even in a case in which the film is formed from the coating liquid in a small amount and has a small thickness of several micrometers.

The fluorine content in the fluorosurfactant is preferably from 3% by mass to 40% by mass, more preferably from 5% by mass to 30% by mass, and particularly preferably from 7% by mass to 25% by mass. A fluorosurfactant having a fluorine content within the above range is effective in terms of the uniformity of the thickness of the coating film and in terms of liquid saving properties, and provides a favorable solubility in the black curable composition.

Examples of fluorosurfactants include: MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F479, MEGAFACE F482, MEGAFACE F780, and MEGAFACE F781 (tradenames, manufactured by DIC Corporation); FLUORAD FC430, FLUORAD FC431, and FLUORAD FC171 (tradenames, manufactured by Sumitomo 3M Limited); SURFLON S-382, SURFLON SC-101, SURFLON SC-103, SURFLON SC-104, SURFLON SC-105, SURFLON SC1068, SURFLON SC-381, SURFLON SC-383, SURFLON S393, and SURFLON KH-40 (tradenames, manufactured by Asahi Glass Co., Ltd.); and SOLSPERSE 20000 (tradename, manufactured by Lubrizol Japan Ltd.).

Examples of nonionic surfactants include polyoxyethylene lauryl ether, polyoxyethylene stearyl ether, polyoxyethylene oleyl ether, polyoxyethylene octyl phenyl ether, polyoxyethylene nonyl phenyl ether, polyethyleneglycol dilaurate, polyethyleneglycol distearate, and sorbitan fatty acid esters (such as PLURONIC L10, L31, L61, L62, 10R5, 17R2, and 25R2 and TETRONIC 304, 701, 704, 901, 904, and 150R1 (tradenames, manufactured by BASF)).

Examples of cationic surfactants include: phthalocyanine derivatives (an example of commercially available product thereof is EFKA-745 available from Morishita & Co., Ltd.); organosiloxane polymer KP341 (tradename, manufactured by Shin-Etsu Chemicals Co., Ltd.); (meth)acrylic (co)polymers POLYFLOW No. 75, No. 90, and No. 95 (tradenames, manufactured by KYOEISHA CHEMICAL Co., Ltd.); and W001 (tradename, available from Yusho Co., Ltd.).

Examples of anionic surfactants include W004, W005, and W017 (tradenames, available from Yusho Co., Ltd.).

Examples of silicone surfactants include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (tradenames, manufactured by Toray Silicone Company, Ltd.); TSF-4440, TSF-4300, TSF-4445, TSF-444(4)(5)(6)(7)6, TSF-4460, and TSF-4452 (tradenames, manufactured by Momentive Performance Materials Inc.); KP341 (tradename, manufactured by Shin-Etsu Chemicals Co., Ltd.); and BYK323 and BYK330 (tradenames, manufactured by BYK-Chemie).

The surfactant may be used singly, or in combination of two or more thereof.

(D-7) Other Additives

Further, the black curable composition may include a cosensitizer, for the purposes of further improving the sensitivity of the sensitizing dye and/or initiator to actinic radiation, or suppressing the inhibition of polymerization of the photopolymerizable compound due to oxygen. Further, if necessary, a known additive such as a diluent, a plasticizer, or an oleophilizing agent may be added to the black curable composition of the invention in order to improve the physical properties of a cured film.

The black curable composition of the invention may be prepared by preparing a mixture of the (A) metal-containing inorganic pigment (preferably in the form of a pigment dispersion composition containing the pigment dispersant), the (B) polymerization initiator, the (C) polymerizable compound, one or more various optional additives, and a solvent, and, optionally, mixing the resultant with one or more further additive such as a surfactant.

The black curable composition of the invention, having the above configuration, cures with high sensitivity and is capable of forming a light-shielding film having excellent light shielding properties. The black curable composition of the invention is useful in the formation of a light-shielding film for a wafer level lens. Further, additional use of the (D-1) alkali-soluble binder polymer facilitates formation of a higher-resolution light shielding pattern.

<Wafer Level Lens>

The wafer level lens of the invention includes a light-shielding film formed from the black curable composition of the invention.

The wafer level lens of the invention is described below in detail.

FIG. 1 is a plan view showing an example of the configuration of the wafer level lens.

Figure 2:
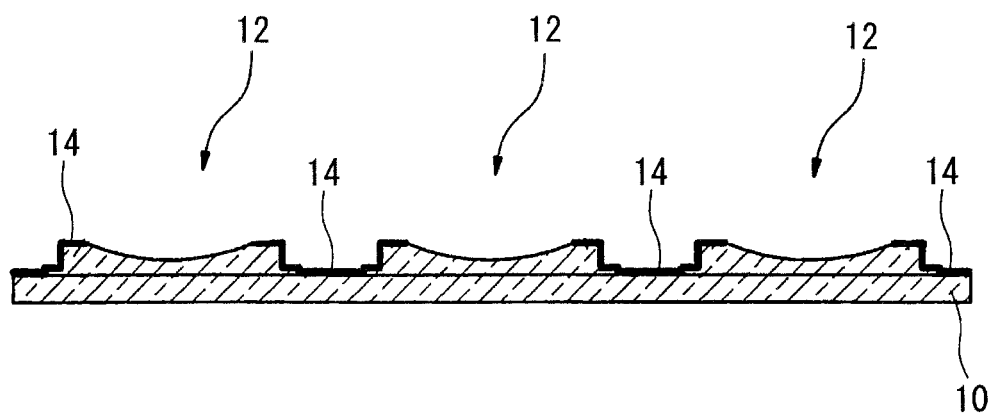
FIG. 2 is a cross-sectional view of the configuration of the wafer level lenses shown in FIG. 1 taken along line A-A.

FIG. 2 is a cross-sectional view of the wafer level lens shown in FIG. 1 taken along line A-A shown in FIG. 1.

As shown in FIG. 2, the wafer level lens array includes a substrate 10, and plural lenses 12 arranged on the substrate 10. The plural lenses 12 are aligned one-dimensionally or two-dimensionally on the substrate 10. A light-shielding film 14 that prevents light transmission through other regions than the lenses is provided at areas between the plural lenses 12. The black curable composition of the invention is used in the formation of the light-shielding film 14.

In this embodiment, a configuration in which plural lenses 12 are two-dimensionally arranged on the substrate 10 as shown in FIG. 1 is described as an example. The lenses 12 are generally made of the same material as that of the substrate 10, and are integrally molded on the substrate 10, or molded as a separate structure and then fixed onto the substrate.

The above configuration is only an example, and the configuration of the wafer level lens of the invention is not limited thereto. Various embodiments may be adopted; for example, the lenses may have a multi-layer structure, and lens modules may be separated out by dicing.

The material for forming the lenses 12 is, for example, glass. Glass, of which types are so many to allow selection of a glass having high refractive index, is suitable as a material of a lens which is desired to have high optical power. Further, glass is advantages also in that glass has excellent thermal resistance, and tolerate reflow mounting onto an image pickup unit or the like.

Another example of the material for forming the lenses 12 is a resin. The resin exhibits excellent processability, and is therefore suitable for simple and inexpensive formation of lens faces using a mold.

An energy-curable resin composition used for forming the wafer level lens may be either of a thermally curable resin composition or a resin composition which is cured by irradiation of an actinic energy radiation (for example, ultraviolet rays or electron beam irradiation).

In consideration of reflow mounting of the image pickup unit, the resin preferably has a relatively high softening point, for example 200° C. or higher. A resin having a softening point of 250° C. or higher is more preferable.

In the following, resins suitable as lens materials are described in detail.

Examples of the UV-curable resin used in the formation of a wafer level lens include a UV-curable silicon resin, a UV-curable epoxy resin, and an acrylic resin. The epoxy resin to be used may have a linear expansion coefficient of from 40 to 80 $[10^{-6}/K]$, and a refractive index of from 1.50 to 1.70, preferably from 1.50 to 1.65. Examples of thermosetting resins include a thermosetting silicon resin, a thermosetting epoxy resin, a thermosetting phenol resin, and a thermosetting acrylic resin. For example, the silicon resin to be used may have a linear expansion coefficient of from 30 to 160 $[10^{-6}/K]$, and a refractive index of from 1.40 to 1.55. The epoxy resin to be used may have a linear expansion coefficient of from 40 to 80 $[10^{-6}/K]$, and a refractive index of from 1.50 to 1.70, preferably from 1.50 to 1.65.

The phenol resin to be used may have a linear expansion coefficient of from 30 to 70 $[10^{-6}/K]$, and a refractive index of from 1.50 to 1.70. The acrylic resin to be used may have a linear expansion coefficient of from 20 to 60 $[10^{-6}/K]$, and a refractive index of from 1.40 to 1.60, preferably from 1.50 to 1.60.

Examples of the thermosetting resin used in the formation of the wafer level lens include an epoxy resin and a siloxane resin. The thermosetting resin may be a commercially available product, specific examples of which include SMX-7852 and SMX-7877 (manufactured by Fuji Polymer Industries Co., Ltd.), IVSM-4500 (manufactured by Toshiba Corporation), and SR-7010 (manufactured by Dow Corning Toray Co., Ltd.).

Examples of the thermoplastic resin used in the formation of the wafer level lens include a polycarbonate resin, a polysulfone resin, and a polyethersulfone resin. The polycarbonate to be used may have a linear expansion coefficient of from 60 to 70 $[10^{-6}/K]$, and a refractive index of from 1.40 to 1.70, preferably from 1.50 to 1.65. The polysulfone resin may have a linear expansion coefficient of from 15 to 60 $[10^{-6}/K]$, and a refractive index of 1.63. The polyether sulfone resin to be used may have a linear expansion coefficient of from 20 to 60 $[10^{-6}/K]$, and a refractive index of 1.65.

In general, optical glass has a linear expansion coefficient of from 4.9 to 14.3 $[10^{-6}/K]$ at 20° C., and a refractive index of from 1.4 to 2.1 at a wavelength of 589.3 nm. Quartz glass has a linear expansion coefficient of from 0.1 to 0.5 $[10^{-6}/K]$, and a refractive index of about 1.45.

The resin for forming the wafer level lens preferably has a moderate fluidity before curing, from the viewpoint of moldability such as capability of being molded to reflect the mold shape. Specifically, the resin is preferably a liquid at normal temperature, and has a viscosity of preferably from about 1000 mPa·s to about 50000 mPa·s.

The resin for forming the wafer level lens preferably has a thermal resistance such that the resin after curing does not thermally deform even when subjected to a reflow process. From this viewpoint, the glass transition temperature of the cured product is preferably 200° C. or higher, more preferably 250° C. or higher, and particularly preferably 300° C. or higher. In order to impart such a high thermal resistance to the resin composition, it is necessary to restrain the motion at the molecular level. Examples of effective methods include (1) a method of increasing the cross-linking density per unit volume, (2) a method of using a resin having a robust ring structure (for example, an alicyclic structure such as cyclohexane, norbornane, or tetracyclododecane, an aromatic ring structure such as benzene or naphthalene, Cardo structure such as 9,9'-biphenyl fluorene, a resin having a spiro structure such as spirobiindane, specifically, for example, resins described in JP-A 9-137043, JP-A 10-67970, JP-A No. 2003-55316, JP-A No. 2007-334018, JP-A No. 2007-238883, etc.), (3) a method of uniformly dispersing a high-Tg material such as inorganic particles (examples are described in JP-A 5-209027, JP-A 10-298265, etc.). Plural methods selected from the above methods may be used in combination. Control of the thermal resistance is preferably performed within the range in which other characteristics such as fluidity, shrinkage ratio, and refractive index are not impaired.

From the viewpoint of the transfer accuracy of the shape, a resin composition that exhibits low volume shrinkage during curing reaction is preferable. The curing shrinkage of the resin composition used in the invention is preferably 10% or less, more preferably 5% or less, particularly preferably 3% or less.

Examples of the resin composition exhibiting a low curing shrinkage include:

(1) a resin composition containing a high-molecular-weight curing agent (such as prepolymer), examples of which are described in JP-A No. 2001-19740, JP-A No. 2004-302293, JP-A No. 2007-211247, and the like; the number average molecular weight of the high-molecular-weight curing agent is preferably in the range of from 200 to 100,000, more preferably from 500 to 50,000, and particularly preferably from 1,000 to 20,000, and the value of (the number average molecular weight of the curing agent/the number of reactive groups for curing) is preferably in the range of from 50 to 10,000, more preferably from 100 to 5,000, and particularly preferably from 200 to 3,000;

(2) a resin composition containing a non-reactive material (such as organic/inorganic particles or non-reactive resins), examples of which are described in JP-A 6-298883, JP-A 2001-247793, JP-A 2006-225434, and the like;

(3) a resin composition containing a low-shrinkage reactive group for curing, examples of which include a ring-opening polymerizable group (such as an epoxy group (described in, for example, JP-A No. 2004-210932), an oxetanyl group (described in, for example, JP-A 8-134405), an episulfide group (described in, for example, JP-A No. 2002-105110), or a cyclic carbonate group (described in, for example, JP-A 7-62065)), an ene/thiol curable group (described in, for example, JP-A No. 2003-20334), or a hydrosilylated curable group (described in, for example, JP-A No. 2005-15666);

(4) a resin composition containing a resin having a rigid skeleton (such as fluorene, adamantane, or isophorone), examples of which are described in, for example, JP-A 9-137043;

(5) a resin composition containing two types of monomers having respectively different polymerizable groups and forming an interpenetrating network structure (so-called IPN structure), examples of which are described in, for example, JP-A No. 2006-131868; and (6) a resin composition containing a swellable material, examples of which are described in, for example, JP-A No. 2004-2719 and JP-A No. 2008-238417. These resin compositions can be suitably used in the invention. Combined use of plural curing-shrinkage reducing methods (for example, combined use of a prepolymer containing a ring-opening polymerizable group and a resin composition containing particles) is preferable from the viewpoint of optimizing physical properties.

It is preferable to use two or more resin compositions having different Abbe numbers (including a high Abbe-number resin and a low Abbe-number resin) for forming the wafer level lens of the invention.

The high Abbe-number resin preferably has an Abbe number (vd) of 50 or more, more preferably 55 or more, and particularly preferably 60 or more. The refractive index (nd) thereof is preferably 1.52 or higher, more preferably 1.55 or higher, and particularly preferably 1.57 or higher.

The high Abbe-number resin is preferably an aliphatic resin, and particularly preferably a resin having an alicyclic structure (for example, a resin having a ring structure such as cyclohexane, norbornane, adamantane, tricyclodecane, or tetracyclododecane, specific examples of which include resins described in JP-A 10-152551, JP-A No. 2002-212500, JP-A No. 2003-20334, JP-A No. 2004-210932, JP-A No. 2006-199790, JP-A No. 2007-2144, JP-A No. 2007-284650, and JP-A No. 2008-105999).

The low Abbe-number resin preferably has an Abbe number (vd) of 30 or less, more preferably 25 or less, and particularly preferably 20 or less. The refractive index (nd) thereof is preferably of 1.60 or higher, more preferably 1.63 or higher, and particularly preferably 1.65 or higher.

The low Abbe-number resin is preferably a resin having an aromatic structure, examples of which include a resin containing a structure such as 9,9'-diarylfluorene, naphthalene, benzothiazole, or benzotriazole. Specific examples thereof include resins described in JP-A 60-38411, JP-A 10-67977, JP-A No. 2002-47335, JP-A No. 2003-238884, JP-A No. 2004-83855, JP-A No. 2005-325331, JP-A No. 2007-238883, International Publication No. WO 2006/095610, and Japanese Patent No. 2537540.

It is also preferable to use an organic-inorganic composite material in which inorganic particles are dispersed in a matrix, as a resin used for the formation of a wafer level lens. The use of the organic-inorganic composite material may aim at increasing the refractive index or adjusting the Abbe number. Examples of the inorganic particles include oxide particles, sulfide particles, selenide particles, and telluride particles. More specific examples include particles of zirconium oxide, titanium oxide, zinc oxide, tin oxide, or zinc sulfide.

In an embodiment, the inorganic particles are selected from zirconium oxide particles, titanium oxide particles, zinc oxide particles, tin oxide particles, niobium oxide particles, cerium oxide particles, aluminum oxide particles, lanthanum oxide particles, yttrium oxide particles, or zinc sulfide particles.

In particular, in the high Abbe-number resin, it is preferable to disperse lanthanum oxide particles, aluminum oxide particles, zirconium oxide particles, or the like. In the low Abbe-number resin, it is preferable to disperse titanium oxide particles, tin oxide particles, zirconium oxide particles, or the like. The inorganic particles to be used may include only one type of inorganic particles, or a combination of two or more types of inorganic particles. The inorganic particles may include particles of a composite of plural ingredients. For various purposes such as reduction of photocatalytic activity and reduction of water absorptivity, the inorganic particles may be doped with a metal other than the substance of the inorganic particles, the surface layer of the inorganic particles may be covered with a metal oxide, such as silica or alumina, other than the substance of the inorganic particles, and/or the surface of the inorganic particle may be modified with a silane coupling agent, a titanate coupling agent, an organic acid (such as a carboxylic acid, a sulfonic acid, a phosphoric acid, or a phosphonic acid), or a dispersant having an organic acid group. The number average particle size of the inorganic particles is typically in the range of from 1 nm to 1000 nm. If the number average particle size of the inorganic particles is excessively small, the properties of the material may alter. If the number average particle size of the inorganic particles is excessively large, effects of Rayleigh scattering are significant in a case in which the difference in refractive index between the resin matrix and the inorganic particles is large. Accordingly, the number average particle size of the inorganic particles is preferably in the range of from 1 nm to 15 nm, more preferably from 2 nm to 10 nm, and particularly preferably from 3 nm to 7 nm. Further, a narrower particle size distribution of the inorganic particles is more preferable. Although there many ways of defining such monodispersed particles, the numerical range defined in JP-A No. 2006-160992 is an example of a preferable range of particle diameter distribution.

Here, the number average primary particle size can be measured, for example, by an X-ray diffraction (XRD) device or a transmission electron microscope (TEM).

The refractive index of the inorganic particles at 22° C. and a wavelength of 589.3 nm is preferably in the range of from 1.90 to 3.00, more preferably from 1.90 to 2.70, and particularly preferably from 2.00 to 2.70.

The content of the inorganic particles is preferably 5% by mass or more, more preferably from 10 to 70% by mass, and particularly preferably from 30 to 60% by mass, relative to the resin, from the viewpoint of transparency and provision of high refractive index.

Any of the UV-curable resin, the thermosetting resin, or the thermoplastic resin described as the material of the wafer level lens in the above may be used as a resin for forming a matrix, which is used in the organic-inorganic composite material. Further examples of the resin for forming a matrix include: a resin having a refractive index higher than 1.60, such as those described in JP-A No. 2007-93893; a block copolymer including a hydrophobic segment and a hydrophilic segment, such as those described in JP-A No. 2007-211164; a resin having, at a polymer terminal or at a side chain, a functional group capable of forming a chemical bond with inorganic particles, such as those described in JP-A Nos. 2007-238929, 2010-043191, 2010-065063, and 2010-054817, and a thermoplastic resin as described in JP-A Nos. 2010-031186 and 2010-037368. If necessary, an additive such as a plasticizer or a dispersant may be added to the organic-inorganic composite material.

In order to uniformly disperse particles in the resin composition, it is preferable to disperse particles by appropriately using, for example, a dispersant containing a functional group having reactivity with a monomer for forming the matrix (such as those described in working examples of JP-A No. 2007-238884), a block copolymer including a hydrophobic segment and a hydrophilic segment (such as those described in JP-A No. 2007-211164), or a resin having, at a polymer terminal or at a side chain, a functional group capable of forming a chemical bond with the inorganic particles (such as those described in JP-A No. 2007-238929 and JP-A No. 2007-238930).

Further, the resin composition used in the invention may suitably include an additive, examples of which include known release agents such as silicon-based release agents, fluorine-based release agents, and compounds containing a long-chain alkyl group, and antioxidants such as hindered phenol.

The curable resin composition of the invention may include a curing catalyst or initiator, as necessary. Specific examples thereof include a compound that promotes a curing reaction (radical polymerization or ionic polymerization) by the action of heat or an actinic energy radiation, such as those described in paragraph numbers [0065] to [0066] of JP-A No. 2005-92099. The content of the curing reaction promoter may vary depending on the type of the catalyst or initiator, the difference in reactive sites for curing, or the like, and cannot be uniquely limited. In general, the content of the curing reaction promoter is preferably in the range of from 0.1 to 15% by mass, and more preferably from 0.5 to 5% by mass, relative to the total amount of solids of the curable resin composition.

The resin composition used in the production of the wafer level lens of the invention can be prepared by appropriately mixing the above-described ingredients. Separate addition of a solvent is unnecessary in a case in which the liquid low-molecular-weight monomer (reactive diluent) or the like is capable of dissolving other components. If this is not the case, the resin composition can be prepared by dissolving the components using a solvent. The solvent optionally used in the resin composition is not particularly limited as long as a homogenous solution or dispersion can be formed with the solvent without precipitation of the composition; and the solvent may be appropriately selected. Specific examples of the solvent include ketones (such as acetone, methyl ethyl ketone, and methyl isobutyl ketone), esters (such as ethyl acetate and butyl acetate), ethers (such as tetrahydrofuran and 1,4-dioxane), alcohols (such as methanol, ethanol, isopropyl alcohol, butanol, and ethylene glycol), aromatic hydrocarbons (such as toluene and xylene), and water. When the resin composition contains a solvent, it is preferable to perform, after casting of the composition on a substrate and/or a mold and drying of the solvent, a mold shape transfer operation.

(Formation of Wafer Level Lens)

The material of the substrate 10 may be selected from the above-described molding materials usable for forming the lenses 12. The substrate 10 may be formed from the same material as the molding material for forming the lenses 12. Alternatively, when the substrate 10 is formed from a material that is transparent to visible light, such as glass, the material may be different from the molding material for forming the lenses 12. In this case, the material for forming the substrate 10 is preferably a material having a linear expansion coefficient that is equal to or extremely close to that of the material for forming the lenses 12. If the linear expansion coefficient of the material forming the lenses 12 is identical or close to that of the material forming the substrate 10, distortion or cracking of the lenses 12 that occurs during heating due to difference in linear expansion rate is suppressed in the process of reflow mounting the wafer level lens on an image pickup unit.

Although not shown in the drawing, an infrared filter (IR filter) may be formed on the light incidence side of the substrate 10.

Figure 3:
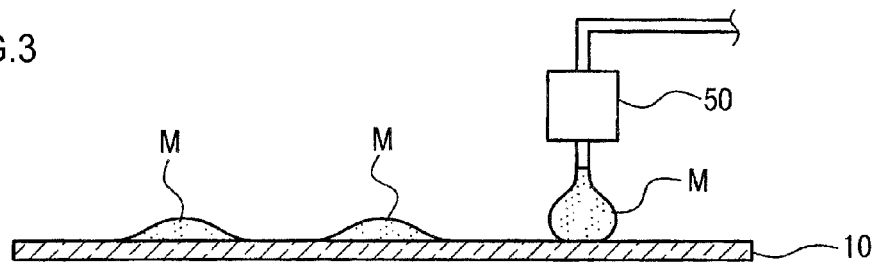
FIG. 3 is a view showing the state in which a molding material for forming a lens is supplied to a substrate.

FIG. 3 is a view showing the state in which a resin as a molding material (designated by "M" in FIG. 3) is supplied to a substrate. As shown in FIG. 3, the molding material M is dripped on regions of the substrate 10 at which lenses are to be formed, using a dispenser 50. Here, an amount of the molding material M corresponding to one lens 12 is provided to each region to be supplied with the molding material.

Figure 4A:
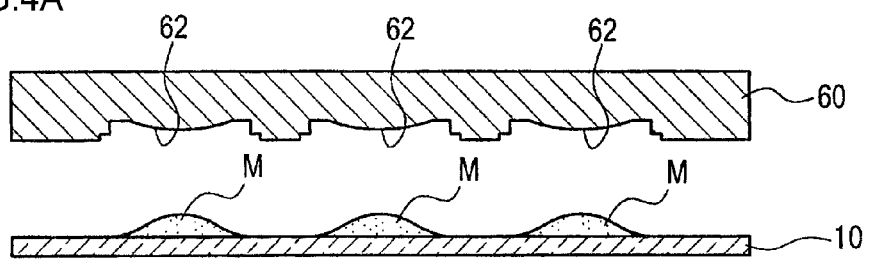
FIGS. 4A to 4C are views showing the procedure of molding lenses on a substrate by using a mold.

After the molding material M is supplied to the substrate 10, a mold 60 for forming lenses is disposed thereon as shown in FIG. 4A. The mold 60 is provided with depressed areas 62 for forming the shape of the lenses 12 by transfer, so as to correspond to the desired number of the lenses 12.

Figure 4B:
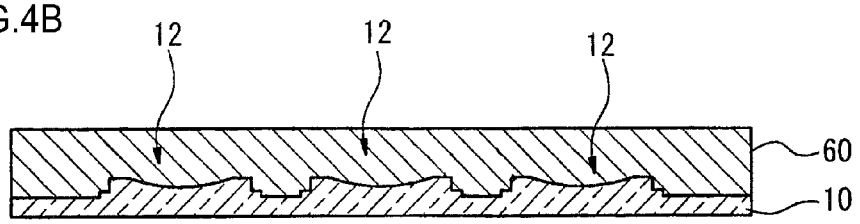

As shown in FIG. 4B, the mold 60 is pressed against the molding material M on the substrate 10, and the molding material M is deformed to conform to the shape of depressed areas. While the mold 60 is pressed against the molding material M, the molding material M is cured by irradiating heat or ultraviolet rays from the outside of the mold in a case in which the molding material M is a thermosetting resin or a UV curable resin.

Figure 4C:
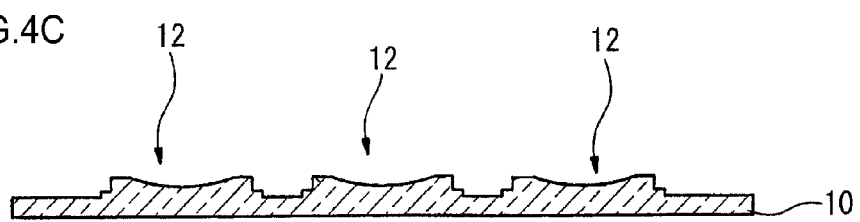

After the molding material M is cured, the substrate 10 and the lenses 12 are released from the mold 60, as shown in FIG. 4C.

Figure 5A:
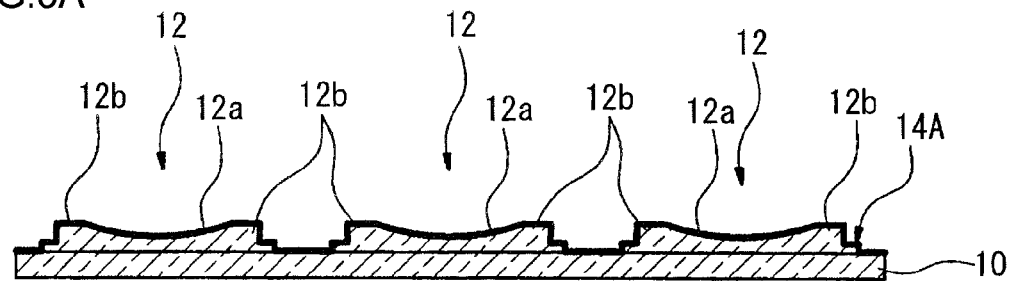
FIGS. 5A to 5C are schematic views showing a progress of forming a patterned light-shielding film formed from the black curable composition of the present invention, on a substrate on which lens have been formed by molding.
Figure 5B:
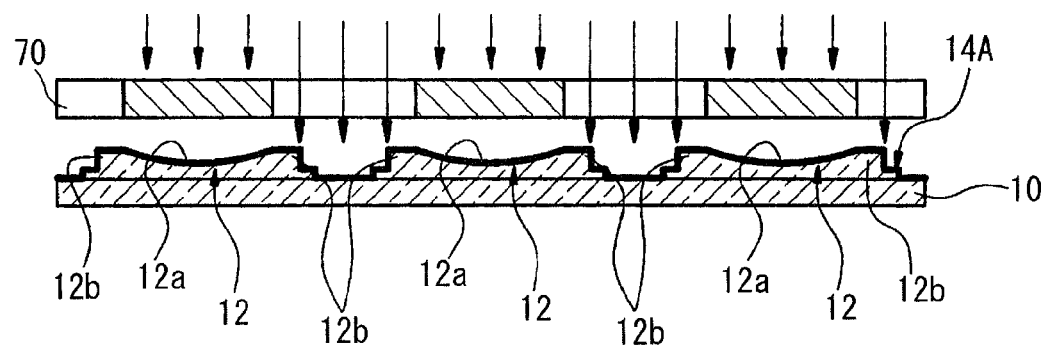
Figure 5C:
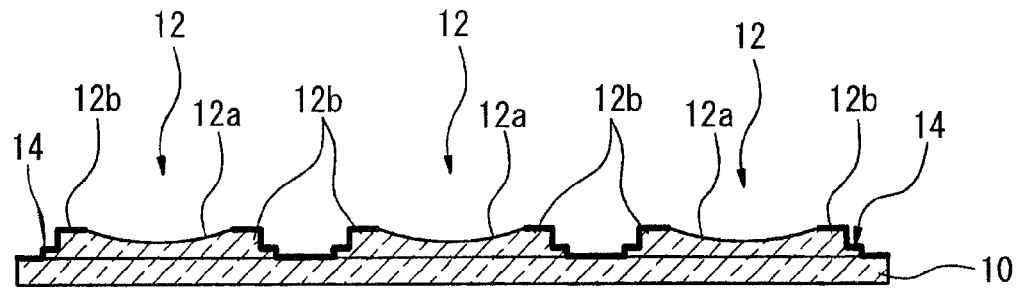

FIGS. 5A to 5C are schematic cross-sectional views showing a process of providing a light-shielding film on the substrate provided with the formed lenses.

(Formation of Light-Shielding Film)

Next, a method of forming a patterned light-shielding film is described below.

The method of forming a light-shielding film includes a light-shielding coating layer formation process (black curable composition coating layer formation process) of coating the black curable composition of the invention on the substrate 10 to form a black curable composition coating layer 14A, a light exposure process of patternwise exposing the light-shielding coating layer 14A to light through a mask 16, and a development process of developing the light-shielding coating layer after the light exposure to remove uncured portions, thereby forming a patterned light-shielding film 14. The formation of the patterned light-shielding film may be carried out before or after production of the lenses 12, without particular limitation.

Individual processes of the production method of the invention are described below.

<Black Curable Composition Coating Layer Formation Process>

In the light-shielding coating layer formation process, as shown in FIG. 5A, the black curable composition is coated on the substrate 10, thereby forming a coating layer (hereinafter, referred to as "light-shielding coating layer" in some cases) 14A formed from the curable composition and exhibiting a low light reflection ratio. Here, the light-shielding coating layer 14A is formed to completely cover the lens-side surface of the substrate 10 and the surfaces of lens faces 12a and lens periphery portions 12b of the lenses 12.

The substrate 10 used in the present process is not particularly limited, and examples thereof include soda-lime glass, PYREX (registered trademark) glass, quartz glass and transparent resins.

As used herein, the substrate 10 refers to a structure including both the substrate 10 and the lens(es) 12 in an embodiment in which the lens(es) 12 and the substrate 10 are integrally formed.

Further, an undercoat layer may be provided on the substrate 10 as necessary in order to improve adhesion to an upper layer, prevent diffusion of a material, or flatten the surface of the substrate 10.

As a method of coating the substrate 10 and the lenses 12 with the black curable composition, various types of coating methods such as slit coating, a spray coating method, an inkjet method, spin coating, cast coating, roll coating, and a screen printing method may be employed.

The film thickness of the black curable composition immediately after coating thereof is preferably in the range of from 0.1 µm to 10 µM, more preferably from 0.2 µm to 5 µm, and still more preferably from 0.2 µm to 3 µm, from the viewpoints of film thickness uniformity of the coated film and ease of drying the coating solvent.

Drying (pre-baking) of the light-shielding coating layer 14A (black curable composition coating layer) coated on the substrate 10 may be carried out at a temperature of from 50° C. to 140° C. for from 10 to 300 seconds using, for example, a hot plate or an oven.

The coating film thickness of the black curable composition after drying (hereinafter, referred to as "dry film thickness" in some cases) may be freely selected in consideration of desired performance such as light shielding properties, and is typically in the range of from 0.1 µm to less than 50 µm.

<Light Exposure Process>

In the light exposure process, the light-shielding coating layer 14A (black curable composition coating layer) formed through the light-shielding coating layer formation process is subjected to patternwise light exposure. Although the patternwise light exposure may be scanning light exposure, it is preferable that the patternwise light exposure is conducted by light exposure through a mask 70 having a predetermined mask pattern, as shown in FIG. 5B.

In the light exposure in the present process, the patternwise light exposure of the light-shielding coating layer 14A may be carried out by light exposure through a predetermined mask pattern; as a result of the light exposure, only light-irradiated portions of the light-shielding coating layer 14A are cured. Here, a mask pattern to be used is a mask pattern with which the surfaces of the lens periphery portions 12b and the surface of the substrate 10 between the lenses 12 are irradiated with light. In this manner, the light irradiation causes curing of the light-shielding coating layer 14A only in the other region than the lens faces 12a, and the cured region forms light-shielding films 14. Preferable examples of radiations that can be used for the light exposure include ultraviolet radiations such as g-line, h-line and i-line. The light source for the radiation used for the light exposure may be a single-wavelength light source, or a light source that emits light containing all wavelength components, such as a high pressure mercury lamp.

<Development Process>

Subsequent to the light exposure process, an alkali development treatment (development process) is carried out. In the development process, regions that have not been irradiated with light in the light exposure process, that is, uncured regions of the light-shielding coating layer 14A are dissolved in an alkaline aqueous solution, thereby leaving only portions that have been cured by the light irradiation. In this example, only portions of the light-shielding coating layer 14A that are formed on the lens faces 12a are removed, and the cured light-shielding film 14 present on the other region is left (see FIG. 5C).

Examples of the alkali agent contained in the developer used in the development process include an organic alkali agent, an inorganic alkali agent, and a combination thereof. In the light-shielding film formation in the invention, an organic alkali developer is preferable from the viewpoint of suppression of damage to, for example, neighboring circuits.

Examples of the alkali agent used in the developer include organic alkaline compounds such as aqueous ammonia, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene; and inorganic compounds such as sodium hydroxide, potassium hydroxide, sodium hydrogen carbonate and potassium hydrogen carbonate.

An alkaline aqueous solution in which an alkali agent, such as those described above, is diluted with pure water so as to give a concentration of from 0.001% by mass to 10% by mass, and preferably from 0.01% by mass to 1% by mass, is preferable for use as the developer.

The development temperature is usually in the range of from 20° C. to 30° C., and the development time is in the range of from 20 to 90 seconds.

In a case in which a developer formed of such an alkaline aqueous solution is used, washing (rinsing) with pure water is generally carried out after unexposed portions of the coated film are removed by the developer. Specifically, after the development treatment, the developer is removed by sufficient washing with pure water, and the substrate having the light-shielding coating layer is subjected to a drying process.

If necessary, the production process of the present embodiment may further include, after the light-shielding coating layer formation process, light exposure process, and development process are carried out, a curing process of curing the formed light-shielding pattern by heating (post-baking) and/or exposing to light.

The post-baking is a heat treatment conducted after development in order to complete the curing, and is usually a thermal curing treatment at from 100° C. to 250° C. The conditions such as the temperature and time of the post-baking can be appropriately set depending on the material of the substrate or lens. For example, when the substrate is glass, the post-baking temperature is preferably from 180° C. to 240° C., among the above-specified temperature range.

This post-baking treatment may be carried out on the light-shielding film 14 after development, in a continuous manner or batchwise manner using a heating device such as a hot plate, a convection oven (hot air circulation type dryer), or a high-frequency heater under the above-described post-baking conditions.

In the above procedure, although a case in which the shape of the lenses 12 is a concave shape is described as an example, the shape of the lenses 12 is not particularly limited, and may be a convex shape or an aspheric shape. In the above procedure, although a wafer level lens having plural lenses 12 formed on one side of the substrate 10 is described as an example, a configuration in which plural lenses 12 are formed on both sides of the substrate 10 may be taken. In this case, a patterned light-shielding film 14 is formed on the region other than the lens faces, on both sides.

Figure 6:
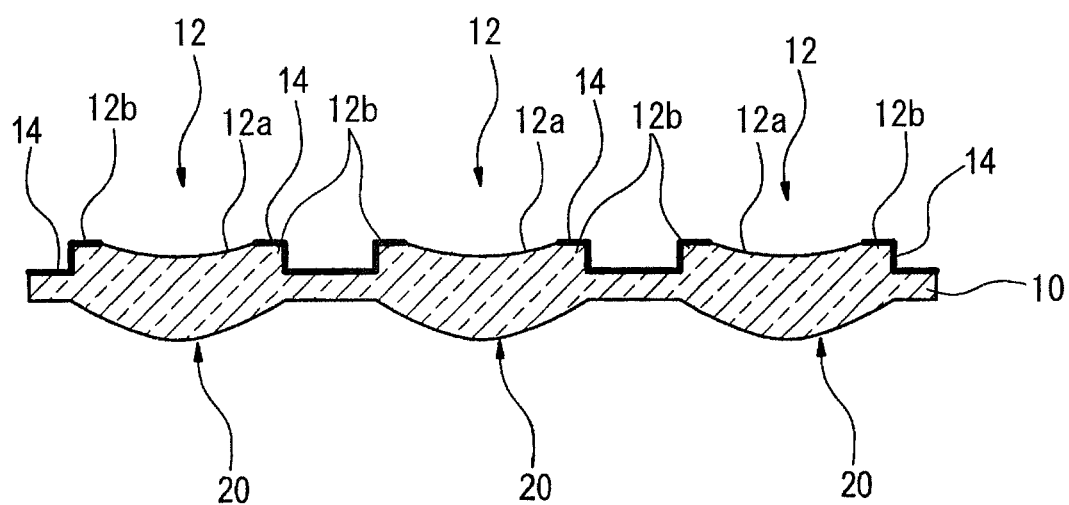
FIG. 6 is a view showing another configuration example of a wafer level lenses.

FIG. 6 is a view showing another configuration example of a wafer level lens. The wafer level lens shown in FIG. 6 has a configuration (monolithic type) in which the substrate 10 and the lenses 12 are simultaneously molded using the same molding material. The molding material may be selected from the above-described molding materials. In this example, plural concave lenses 12 are formed on one side of the substrate 10 (upper side in FIG. 6), and plural convex lens 20 are formed on the other side of the substrate 10 (lower side in FIG. 6). The region other than the lens face 12a of the substrate 10, that is, the surface of the substrate 10 and the surfaces of the lens periphery portions 12b are provided with a patterned light-shielding film 14. The patterning procedure described above may be applied as the patterning method for forming the light-shielding film 14.

Next, another procedure of patterning for forming a light-shielding film is described below. In the above-described example, a patterned light-shielding film is formed on a substrate provided with the lenses. In contrast, in the following procedure, a patterned light-shielding film is first formed on a substrate, and then lenses are formed on the substrate by molding.

Figure 7A:
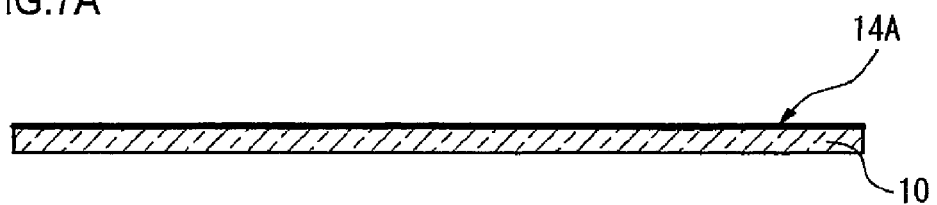
FIGS. 7A to 7C are schematic views showing another embodiment of a process of forming a light-shielding film using the black curable composition of the present invention.
Figure 7B:
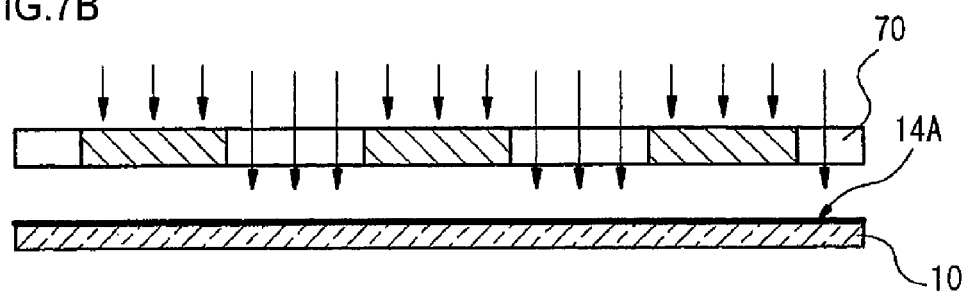
Figure 7C:
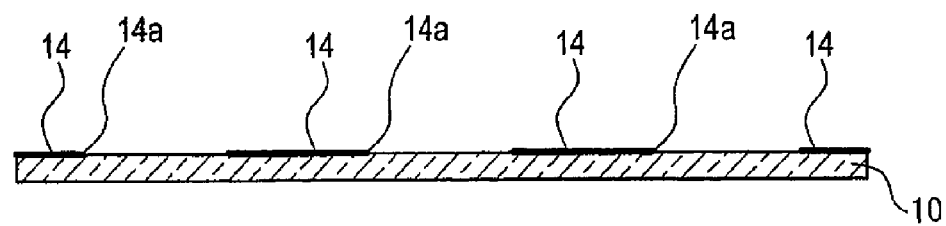
Figure 8A:
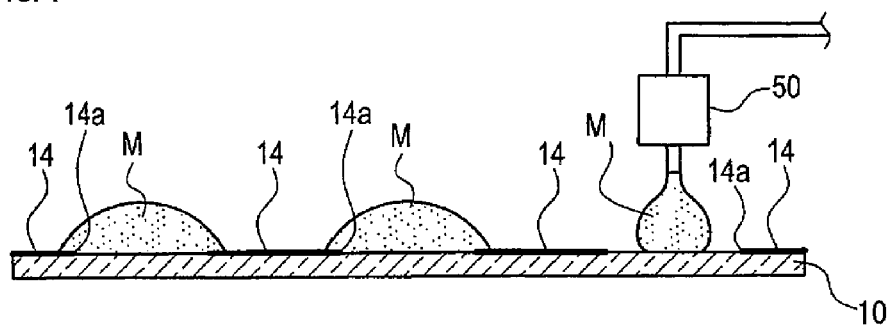
FIGS. 8A to 8C are schematic views showing a process of molding lenses on a substrate having a patterned light-shielding film formed from the black curable composition of the present invention.
Figure 8B:
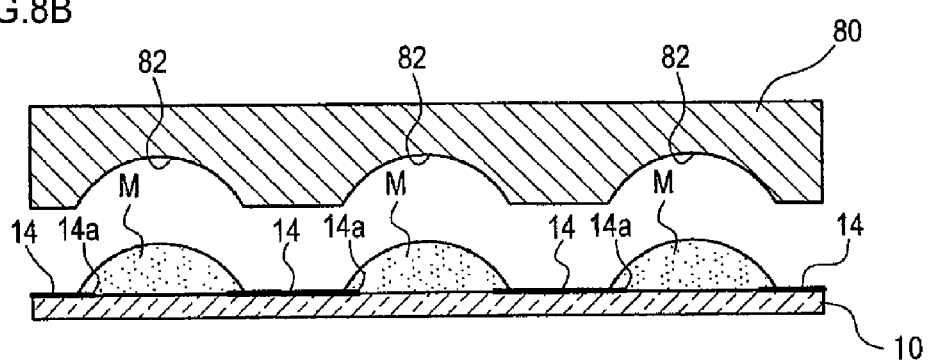
Figure 8C:
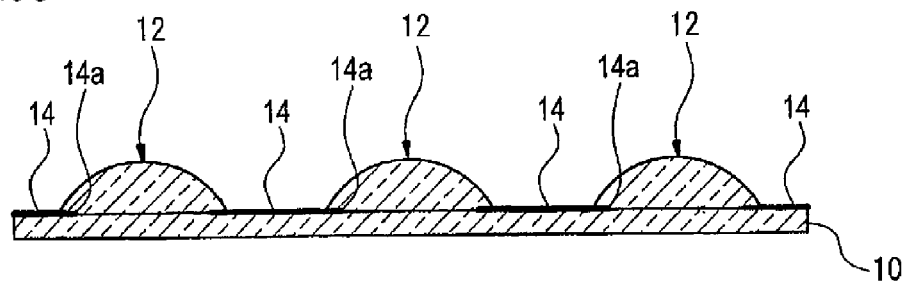

FIGS. 7A to 7C are schematic views showing another process of forming a patterned light-shielding film. FIGS. 8A to 8C are schematic views showing a process of molding lenses 12 after the formation of a patterned light-shielding film 14.

First, as shown in FIG. 7A, a light-shielding coating layer formation process for forming the light-shielding coating layer 14A is carried out by coating a black curable composition on the substrate 10.

Then, drying of the light-shielding coating layer 14A coated on the substrate 10 is carried out at a temperature of from 50° C. to 140° C. for from 10 to 300 seconds, using a hot plate, an oven, or the like.

The dry film thickness of the black curable composition may be appropriately selected depending on desired performance such as light shielding properties, and the dry film thickness of the black curable composition is typically in the range of from 0.1 μm to less than 50 μm.

Then, as shown in FIG. 7B, a light exposure process of patternwise exposing the light-shielding coating layer 14A formed through the light-shielding coating layer formation process to light through a mask 70 is carried out. The mask 70 has a predetermined mask pattern. In the light exposure in this process, the light-shielding coating layer 14 is patternwise exposed to light, thereby curing only portions of the light-shielding coating layer 14A that have been irradiated with light. Here, the mask pattern to be used is a mask pattern with which only the light-shielding coating layer 14A in the region other than portions that are to become lens apertures 14a of the lenses 12 when the lenses 12 are molded in a subsequent process is irradiated with light. In this manner, only the light-shielding coating layer 14A in the region other than the portions that are to become lens apertures 14a of the lenses 12 is cured by irradiation with light. As in the above-described procedure, preferable examples of radiations that can be used for the light exposure include ultraviolet lights such as g-line, h-line, and i-line.

Subsequently, an alkali development treatment (development step) is carried out. As a result, only the light-shielding coating layer 14A in the portions corresponding to the lens apertures 14a of the lenses 12, which are portions of the light-shielding coating layer 14A that have not been cured in the patternwise light exposure, is dissolved in an alkaline aqueous solution. In addition, the photo-cured light-shielding coating layer 14A in the region other than the portions corresponding to the lens apertures 14a of the lenses 12 remains on the substrate 10 to form a light-shielding film 14 (see FIG. 7C). The alkali agent may be selected from the above-described alkali agents usable in the above-described procedure. Thereafter, the developer is removed by washing, followed by drying.

Also in this embodiment, after the light-shielding coating layer formation process, the light exposure process, and the development process are carried out, a curing process of curing the formed light-shielding film by the above-described post-baking and/or light exposure may be carried out, if necessary.

Next, a process of producing a wafer level lens is described below, in which the light-shielding film 14 is first formed, and then the lenses 12 are formed.

As shown in FIG. 8A, the molding material M for forming the lenses 12 is dripped on the substrate 10 on which the patterned light-shielding film 14 has been formed, using a dispenser 50. The molding material M is supplied so as to cover the portion corresponding to the lens aperture 14a of each lens 12 and partially cover end portions of the light-shielding film 14 that are adjacent to the lens aperture 14a.

After the molding material M is supplied to the substrate 10, a mold 80 for forming a lens is disposed as shown in FIG. 8B. The mold 80 is provided with depressed areas 82 for transferring the shape of the lenses 12, according to the desired number of the lenses 12.

The mold 80 is pressed against the molding material M on the substrate 10, thereby deforming the molding material M to conform to the shape of the depressed areas. While the mold 80 is pressed against the molding material M, the molding material M is cured by irradiating heat or ultraviolet rays from the outside of the mold in a case in which the molding material M is a thermosetting resin or UV curable resin.

After the molding material M is cured, the substrate 10 and the lenses 12 are released from the mold 80, and a wafer level lens having a patterned light-shielding film 14 on the substrate 10 is obtained as shown in FIG. 8C.

As described above, the configuration of the patterned light-shielding film 14 provided on the wafer level lens is not limited to the configuration shown in FIG. 2 in which the light-shielding film 14 is provided in the region other than the lens faces 10a of the lenses 12, and the configuration shown in FIG. 8C in which the light-shielding film 14 is provided in the region other than the lens apertures 14a of the lenses 12 may alternatively be taken.

In the wafer level lens, the light-shielding film 14 exhibiting a low light-reflection ratio is formed in pattern on at least one surface of the substrate 10. The thus-formed light-shielding film sufficiently shields light in the region other than the lens faces 12a or lens apertures 14a of the lenses 12, and inhibits the generation of reflected light. Accordingly, when applied to an image pickup module equipped with an image pickup device, the wafer level lens prevents problems in image pickup such as ghost or flare caused by reflected light.

Further, since the light-shielding film 14 is disposed on a surface of the substrate, there is no need to attach an additional light-shielding member to the wafer level lens, as a result of which an increase in production costs can be avoided.

In a configuration in which a structure having an irregular surface is provided around the lens such as the configuration disclosed in International Publication No. WO 2008/102648, the light incident on the structure is reflected or diverged, which may cause a problem such as ghost. In consideration of this, a configuration may be taken in which a patterned light-shielding film 14 is provided in the region other than the lens faces 10a of the lenses 12 as shown in FIG. 2; this configuration enables shielding of light in the region other than the lens faces 10a, thereby improving optical performance.

EXAMPLES

The invention is described in detail below with reference to the following Examples, but the invention is not limited thereto. Hereinafter, "part(s)" and "%" represent "part(s) by mass" and "% by mass", respectively, unless otherwise specified.

<Preparation of Titanium Black Dispersion Liquid (TB Dispersion Liquid 1)>

Ingredients of the following composition I were subjected to a high-viscosity dispersing treatment with a two-roll mill, whereby a dispersion was obtained. The viscosity of the dispersion was 40,000 mPa·s.

In this process, kneading may be carried out for 30 minutes with a kneader before the high-viscosity dispersing treatment.

(Composition I)

| | |
|---|---|
| Titanium Black 13M-C having an average primary particle diameter of 75 nm (tradename, manufactured by Mitsubishi Materials Corporation) (Pigment Black 35): | 40 parts |
| Propylene glycol monomethyl ether acetate solution of benzyl methacrylate (BzMA)/methacrylic acid (MAA) copolymer (BzMA/MAA = 60/40 (molar ratio), Mw: 30,000, solids content: 40%): | 8 parts |
| SOLSPERSE 5000 (tradename, manufactured by Lubrizol Japan Ltd.): | 2 parts |

To the obtained dispersion, ingredients of the following composition II were added, and the mixture was stirred for 3 hours under the conditions of 3000 rpm using a homogenizer. The resultant mixed solution was subjected to a fine dispersing treatment for 4 hours using a dispersion machine (DISPERMAT, trade name, manufactured by GETZMANN GMBH) and zirconia beads having a diameter of 0.3 mm as a dispersion medium, whereby a titanium black dispersion liquid (hereinafter, referred to as "TB dispersion liquid 1") was obtained.

The viscosity of the mixed solution was 6.8 mPa·s.

(Composition II)

| | |
|---|---|
| Propylene glycol monomethyl ether acetate solution of benzyl methacrylate (BzMA)/methacrylic acid (MAA) copolymer (BzMA/MAA = 70/30 (molar ratio), Mw: 30000, solids content: 40%): | 10 parts |
| Propylene glycol monomethyl ether acetate: | 200 parts |

<Preparation of Titanium Black Dispersion Liquid (TB Dispersion Liquid 2)>

Ingredients of the following composition III were subjected to a high-viscosity dispersing treatment with a two-roll mill, as a result of which a dispersion was prepared. The viscosity of the dispersion was 40,000 mPa·s.

In this process, kneading may be carried out for 30 minutes with a kneader before the high-viscosity dispersing treatment (Composition III)

| | |
|---|---|
| Titanium black having an average primary particle diameter of 40 nm: | 40 parts |
| Dispersant B-1: | 5 parts |

To the obtained dispersion, ingredients of the following composition IV were added, and the mixture was stirred for 3 hours under the conditions of 3000 rpm using a homogenizer. The resultant mixed solution was subjected to a fine dispersing treatment for 4 hours using a dispersion machine (DISPERMAT, trade name, manufactured by GETZMANN GMBH) and zirconia beads having a diameter of 0.3 mm as a dispersion medium, whereby a titanium black dispersion liquid (hereinafter, referred to as "TB dispersion liquid 2") was obtained.

The viscosity of the mixed solution was 6.8 mPa·s.

(Composition IV)

| Dispersant B-1 (the following structure): | 5 parts |
| --- | --- |
| Propylene glycol monomethyl ether acetate: | 200 parts |

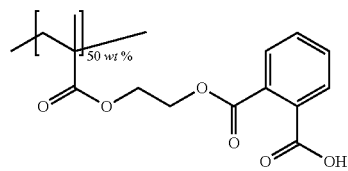
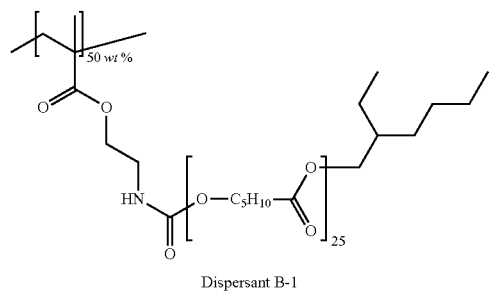

Dispersant B-1

<Preparation of Silver-Tin Dispersion Liquid (ST Dispersion Liquid)>

A solution of 15 g of tin colloid (average primary particle diameter: 20 nm, solids content: 20% by weight, manufactured by Sumitomo Osaka Cement Co., Ltd.), 60 g of silver colloid (average primary particle diameter: 7 nm, solids content: 20% by weight, manufactured by Sumitomo Osaka Cement Co., Ltd.) and 0.75 g of polyvinyl pyrrolidone dissolved in 100 mL of water was added to 200 mL of pure water maintained at 60° C., as a result of which a colloidal solution was obtained.

Then, the resultant colloidal solution was stirred for 60 minutes while maintained at 60° C., and thereafter the colloidal solution was subjected to ultrasonic irradiation for 5 minutes. Then, the colloid solution was concentrated by centrifugal separation, whereby a liquid A having a solids content of 25% was obtained. The liquid A was dried by a freeze dry method, whereby a powder sample was obtained.

Using this powder, a dispersion liquid was prepared in a manner similar to the preparation of the titanium black dispersions.

<Preparation of Red Dispersion Liquid>

| C. I. Pigment Red 254 (coloring ingredient): | 30 parts |
| --- | --- |
| Resin solution (benzyl methacrylate/methacrylic acid/hydroxyethyl methacrylate copolymer, molar ratio: 80/10/10, Mw: 10000, solvent: propylene glycol methyl ether acetate 60%, resin solid concentration: 40%): | 40 parts |
| Solvent: propylene glycol methyl ether acetate: | 20 parts |
| Dispersant: (trade name: BYK-161, BYK): | 2 parts |

Further, the following ingredient (solvent) was further added to the obtained dispersion, and the dispersion was subjected to a fine dispersing treatment with a sand mill for one day.

Solvent: propylene glycol methyl ether acetate (PGMEA): 200 parts

Examples 1 to 5

1. Preparation of Black Curable Composition

Ingredients of the following composition A-1 were mixed with a stirrer, thereby providing a black curable composition A-1.

(Composition A-1)

| Benzyl methacrylate/methyl methacrylate/hydroxyethyl methacrylate/acrylic acid copolymer [50/15/5/30 (molar ratio)] (Binder polymer): | 1.6 parts |
| --- | --- |
| Dipentaerythritol hexaacrylate [(C) polymerizable compound]: | 2.0 parts |
| Pentaerythritol triacrylate [(C) polymerizable compound]: | 1.0 part |
| Polymerization initiator shown in Table 1 below [(B) photopolymerization initiator]: | 0.3 parts |
| Black pigment dispersion liquid [(A) inorganic pigment]: | 24 parts |
| Propylene glycol monomethyl ether acetate: | 10 parts |
| Ethyl 3-ethoxypropionate: | 8 parts |

<Preparation and Evaluation of Light-Shielding Film for Solid-State Image Pickup Device>

The black curable composition obtained above was applied onto a glass wafer by a spin coating method, and then heated on a hot plate at 120° C. for 2 minutes, as a result of which a black curable composition coating layer was formed.

Then, the light-shielding coating layer formed was exposed to light through a photo mask having a hole pattern of 50 mm, using an i-line stepper. The exposure amount was varied at an increment of 50 mJ/cm$^2$, starting from 50 mJ/cm$^2$.

The photosensitive layer after the light exposure was subjected to paddle development at 23° C. for 60 seconds using a 0.3% aqueous solution of tetramethylammonium hydroxide. Thereafter, the photosensitive layer was rinsed with a spin shower, and further washed with pure water, as a result of which a patterned light-shielding film was formed.

From the light-shielding film pattern formed, an exposure amount at which peeling ceases to occur was determined using an optical microscope. If the exposure amount is lower, it is indicated that the adhesion is more effective.

With regard to light shielding properties, the maximum transmittance of a film having a thickness of 2 μm as measured at a wavelength of from 400 nm to 800 nm is shown. A smaller numerical value indicates more favorable light shielding properties. The transmittance of less than 1% is favorable.

TABLE 1

| | Dispersion liquid | Polymerization initiator | Sensitivity (mJ/cm$^2$) | Transmittance (%) |
| --- | --- | --- | --- | --- |
| Example 1 | TB-1 | I-24 | 150 | 0.6 |
| Example 2 | TB-2 | I-24 | 150 | 0.6 |
| Example 3 | TB-1/Red(1/1) | I-28 | 100 | 0.4% or less |
| Example 4 | TB-2/Red(1/1) | I-28 | 100 | 0.4% or less |
| Example 5 | ST | I-24 | 250 | 0.4% or less |
| Comparative Example 1 | Carbon black | I-24 | 500 | 1% |

The polymerization initiators described in Table 1 are exemplary compounds that are shown above and designated by the same reference characters.

From the results shown in Table 1 above, it is understood that the black curable composition of the invention cures with high sensitivity and the wafer level lens having a light-shielding film formed from the black curable composition exhibits excellent light shielding properties, as compared to Comparative Example 1 in which a light-shielding film is formed from a black curable composition containing carbon black. Further, the comparison between Examples 1 to 4 and Example 5 reveals that black curable compositions containing titanium black as a metal-containing inorganic pigment are excellent particular in curing sensitivity, and the comparison between Examples 1 and 2 and Examples 3 and 4 reveals that combined use of titanium black and a red organic pigment further improves light shielding properties while maintaining superior curability.

Examples 6 to 10

1. Preparation of Black Curable Composition

Ingredients of the following composition A-2 were mixed with a stirrer, as a result of which a black curable composition A-2 was obtained.

(Composition A-2)

| | |
|---|---|
| Styrene/methyl methacrylate/methacrylic acid copolymer (50/20/30 [molar ratio]) [binder polymer]: | 2 parts |
| Succinic acid-modified monomer of dipentaerythritol pentaacrylate [(C) polymerizable compound]: | 2.0 parts |
| Pentaerythritol triacrylate [(C) polymerizable compound]: | 2.0 parts |
| 3-methacryloxypropyldimethoxymethylsilane: | 0.1 parts |
| Polymerization initiator shown in Table 2 below [(B) photopolymerization initiator]: | 0.4 parts |
| Black pigment dispersion liquid [(A) Inorganic pigment]: | 24 parts |
| Propylene glycol monomethyl ether acetate: | 10 parts |
| Cyclohexanone: | 8 parts |

Ingredients of the following composition A-1 were mixed with a stirrer, as a result of which a black curable composition A-1 was obtained.

<Preparation and Evaluation of Light-Shielding Film for Solid-State Image Pickup Device>

The black curable composition obtained above was applied onto a glass wafer by a spin coating method, and then heated on a hot plate at 120° C. for 2 minutes, as a result of which a black curable composition coating layer was formed.

Then, the light-shielding coating layer formed was exposed to light through a photo mask having a hole pattern of 50 mm, using a high-pressure mercury lamp. The exposure amount was varied at an increment of 50 mJ/cm$^2$, starting from 100 mJ/cm$^2$.

The light-shielding coating layer after the light exposure was subjected to paddle development at 23° C. for 60 seconds using a 0.3% aqueous solution of tetramethylammonium hydroxide. Thereafter, the photosensitive layer was rinsed with a spin shower, and further washed with pure water, as a result of which a patterned light-shielding film was formed.

From the light-shielding film pattern formed, an exposure amount at which peeling ceases to occur was determined using an optical microscope. If the exposure amount is lower, it is indicated that the adhesion is more effective.

TABLE 2

| | Dispersion liquid | Polymerization initiator | Sensitivity (mJ/cm$^2$) | Transmittance (%) |
|---|---|---|---|---|
| Example 6 | TB-1 | I-24 | 150 | 0.6 |
| Example 7 | TB-2 | I-25 | 150 | 0.6 |
| Example 8 | TB-1/Red(2/1) | I-24 | 150 | 0.4% or less |
| Example 9 | TB-2/Red(2/1) | I-25 | 150 | 0.4% or less |
| Example 10 | ST | I-26 | 300 | 0.4% or less |
| Comparative Example 2 | Carbon black | I-24 | 450 | 1% |

The polymerization initiators described in Table 2 are exemplary compounds that are shown above and designated by the same reference characters. From the results shown in Table 2 above, it is understood that the black curable composition of the invention cures with high sensitivity and the wafer level lens having a light-shielding film formed from the black curable composition exhibits excellent light shielding properties even when the binder polymer and/or the polymerizable compound used in the composition were changed, as compared to Comparative Example 2 in which a light-shielding film is formed from a black curable composition containing carbon black, which is an inorganic pigment not containing a metal. Further, the comparison between Examples 5 to 9 and Example 10 reveals that black curable compositions containing titanium black as a metal-containing inorganic pigment are excellent particularly in curing sensitivity also in this embodiment. Further, the comparison between Examples 6 and 7 and Examples 8 and 9 reveals that combined use of titanium black and a red organic pigment further improves light shielding properties while maintaining superior curability.

The disclosures of Japanese Patent Application Nos. 2009-227927 and 2010-204361 are herein incorporated by reference. All publications, patent applications, and technical standards mentioned in this specification are herein incorporated by reference to the same extent as if each individual publication, patent application, or technical standard was specifically and individually indicated to be incorporated by reference.

Exemplary embodiments of the present invention include the following:

<1>. A black curable composition for a wafer level lens, including (A) a metal-containing inorganic pigment, (B) a polymerization initiator, and (C) a polymerizable compound.

<2>. The black curable composition for a wafer level lens according to <1>, wherein the (A) metal-containing inorganic pigment is titanium black.

<3>. The black curable composition for a wafer level lens according to <1>, wherein the (A) metal-containing inorganic pigment is a metal pigment of silver and/or tin.

<4>. The black curable composition for a wafer level lens according to any one of <1> to <3>, further comprising (D) an organic pigment.

<5>. The black curable composition for a wafer level lens according to <4>, wherein the (D) organic pigment is at least one selected from the group consisting of a red pigment, an orange pigment and a violet pigment.

<6>. The black curable composition for a wafer level lens according to any one of <1> to <5>, wherein the particle diameter of the (A) metal-containing inorganic pigment is from 10 nm to 1 μm.

<7>. The black curable composition for a wafer level lens according to any one of <1> to <6>, wherein the content of the (A) metal-containing inorganic pigment is from 5 to 70% by mass relative to the total mass of the composition.

<8>. The black curable composition for a wafer level lens according to any one of <1> to <7>, further comprising a binder polymer.

<9>. The black curable composition for a wafer level lens according to <8>, wherein the content of the binder polymer is from 1.0 to 5.0% by mass relative to the total solid amount of the composition.

<10>. The black curable composition for a wafer level lens according to any one of <1> to <9>, wherein the (C) polymerizable compound is at least one selected from the group consisting of dipentaerythritol penta(meth)acrylate, dipentaerythritol hexa(meth)acrylate, and dipentaerythritol having 5 or 6 chains each of which is composed of at least one ethyleneglycol residue or propyleneglycol residue and has a (meth)acryloyl group at a terminal thereof.

<11>. A wafer level lens comprising a light-shielding section obtained by curing the black curable composition for a wafer level lens according to any one of <1> to <10>.

<12>. A method of forming a light-shielding pattern including:

forming a black curable layer containing the black curable composition for a wafer level lens of any one of <1> to <10> on a substrate on which plural lenses are provided; and patternwise exposing the black curable layer to light and developing the black curable layer, thereby forming, at peripheral regions of the plural lenses, light-shielding portions containing a cured product of the black curable composition for a wafer level lens.

The invention claimed is:

1. A wafer level lens comprising a light-shielding section obtained by curing a black curable composition for a wafer level lens, said black curable composition comprising (A) titanium black, (B) an oxime ester compound, (C) a polymerizable compound, and (D) C.I. Pigment Red 254, wherein colorants in the composition consist of the (A) titanium black and the (D) C.I. Pigment Red 254.

2. The wafer level lens according to claim 1, wherein the particle diameter of the (A) titanium black is from 10 nm to 1 μm.

3. The wafer level lens according to claim 1, wherein the content of the (A) titanium black is from 5 to 70% by mass relative to the total mass of the composition.

4. The wafer level lens according to claim 1, wherein the black curable composition further comprises a binder polymer.

5. The wafer level lens according to claim 4, wherein the content of the binder polymer in the black curable composition is from 1.0 to 5.0% by mass relative to the total solids amount of the composition.

6. The wafer level lens according to claim 1, wherein the (C) polymerizable compound is at least one selected from the group consisting of dipentaerythritol penta(meth)acrylate, dipentaerythritol hexa(meth)acrylate, and dipentaerythritol having 5 or 6 chains each of which is composed of at least one ethyleneglycol residue or propyleneglycol residue and has a (meth)acryloyl group at a terminal thereof.

7. The wafer level lens according to claim 1, wherein transmittance is 0.4% or less, and the content ratio of the (D) C.I. Pigment Red 254 is not more than 40% by mass with respect to the total amount of the (A) titanium black and the (D) C.I. Pigment Red 254.

8. The wafer level lens according to claim 1, wherein the oxime ester compound comprises Compound I-24 or I-28:

Compound I-24

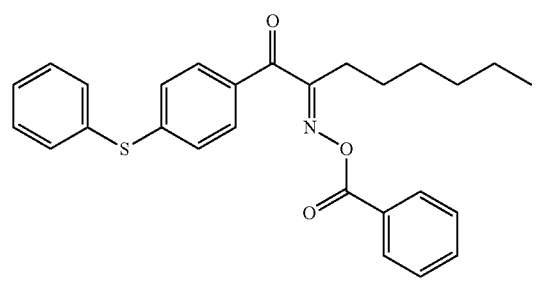

Compound I-28

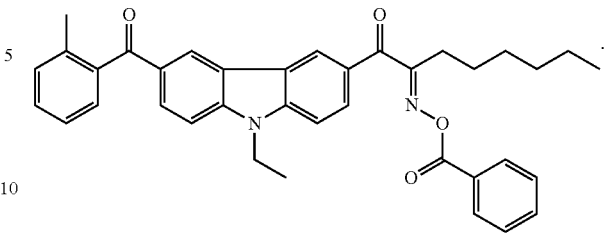

9. A method of forming a light-shielding pattern including:

forming a black curable layer containing a black curable composition for a wafer level lens on a substrate on which a plurality of lenses are provided; and patternwise exposing the black curable layer to light and developing the black curable layer, thereby forming, at peripheral regions of the plurality of lenses, light-shielding portions containing a cured product of the black curable composition for a wafer level lens, wherein said black curable composition for a wafer level lens comprises (A) titanium black, (B) an oxime ester compound, (C) a polymerizable compound, and (D) C.I. Pigment Red 254, and colorants in the composition consist of the (A) titanium black and the (D) C.I. Pigment Red 254.

10. The method of forming a light-shielding pattern according to claim 9, wherein transmittance is 0.4% or less, and the content ratio of the (D) C.I. Pigment Red 254 is not more than 40% by mass with respect to the total amount of the (A) titanium black and the (D) C.I. Pigment Red 254.

11. The method of forming a light-shielding pattern according to claim 9, wherein the oxime ester compound comprises Compound I-24 or I-28:

Compound I-24

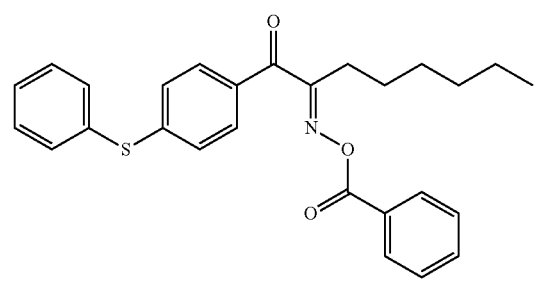

Compound I-28

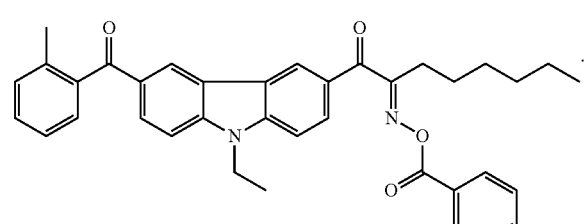

12. A black curable composition for a wafer level lens, comprising (A) titanium black, (B) a polymerization initiator which is an oxime ester compound, (C) a polymerizable compound, and (D) C.I. Pigment Red 254, wherein colorants in the composition consist of the (A) titanium black and the (D) C.I. Pigment Red 254.

* * * * *